US012327809B2

(12) United States Patent
Sharma et al.

(10) Patent No.: US 12,327,809 B2
(45) Date of Patent: Jun. 10, 2025

(54) VERTICALLY STACKED AND BONDED MEMORY ARRAYS

(71) Applicant: Intel Corporation, Santa Clara, CA (US)

(72) Inventors: Abhishek A. Sharma, Hillsboro, OR (US); Wilfred Gomes, Portland, OR (US); Mauro J. Kobrinsky, Portland, OR (US)

(73) Assignee: Intel Corporation, Santa Clara, CA (US)

(*) Notice: Subject to any disclaimer, the term of this patent is extended or adjusted under 35 U.S.C. 154(b) by 811 days.

(21) Appl. No.: 17/355,793

(22) Filed: Jun. 23, 2021

(65) Prior Publication Data

US 2022/0415841 A1 Dec. 29, 2022

(51) Int. Cl.

*H01L 23/00* (2006.01)
*H01L 25/00* (2006.01)
*H01L 25/065* (2023.01)
*H10B 12/00* (2023.01)

(52) U.S. Cl.

CPC .............. *H01L 24/32* (2013.01); *H01L 24/83* (2013.01); *H01L 25/0657* (2013.01); *H01L 25/50* (2013.01); *H10B 12/315* (2023.02); *H10B 12/34* (2023.02); *H01L 2224/32145* (2013.01); *H01L 2224/83894* (2013.01); *H01L 2924/1436* (2013.01)

(58) Field of Classification Search

CPC ..... H01L 24/32; H01L 24/83; H01L 25/0657; H01L 25/50; H10B 12/34; H10B 12/325; H10B 80/00

USPC .......................................................... 257/296

See application file for complete search history.

(56) References Cited

U.S. PATENT DOCUMENTS

| | | | | |
|---|---|---|---|---|
| 8,026,521 | B1 | 9/2011 | Or-Bach et al. | |
| 11,018,264 | B1 | 5/2021 | Gomes et al. | |
| 11,335,686 | B2 * | 5/2022 | Gomes .................. | H10B 12/33 |
| 2012/0003808 | A1 | 1/2012 | Lee | |
| 2015/0102395 | A1 | 4/2015 | Park et al. | |
| 2017/0186844 | A1 | 6/2017 | Kim et al. | |

(Continued)

FOREIGN PATENT DOCUMENTS

| | | | |
|---|---|---|---|
| TW | 202115883 | A | 4/2021 |
| WO | 2018125024 | A1 | 7/2018 |

OTHER PUBLICATIONS

U.S. Appl. No. 16/667,740, filed Oct. 29, 2019, Thin Film Transistor Based Memory Cells on Both Sides of a Layer of Logic Devices.

(Continued)

*Primary Examiner* — Jasmine J Clark
(74) *Attorney, Agent, or Firm* — Akona IP PC

(57) ABSTRACT

Described herein are three-dimensional memory arrays that include multiple layers of memory cells. The layers are stacked and bonded to each other at bonding interfaces. The layers are formed on a support structure, such as a semiconductor wafer, that is grinded down before the layers are bonded. Vias extend through multiple layers of memory cells, including through the support structures and bonding interfaces. Thinning the support structure enables a tighter via pitch, which reduces the portion of the footprint used for vias. The memory cells may include three-dimensional transistors with a recessed gate and extended channel length.

20 Claims, 15 Drawing Sheets

(56) References Cited

U.S. PATENT DOCUMENTS

| | | | |
|---|---|---|---|
| 2020/0035683 | A1 | 1/2020 | Sharma et al. |
| 2020/0144242 | A1 | 5/2020 | Park |
| 2021/0072624 | A1 | 3/2021 | Garland |
| 2021/0125990 | A1 | 4/2021 | Gomes et al. |
| 2021/0134802 | A1 | 5/2021 | Gomes et al. |
| 2021/0151438 | A1 | 5/2021 | Gomes et al. |
| 2021/0159229 | A1 | 5/2021 | Gomes et al. |
| 2021/0193666 | A1 | 6/2021 | Gomes et al. |
| 2021/0375926 | A1 | 12/2021 | Mehandru et al. |
| 2022/0173090 | A1 | 6/2022 | Gomes et al. |

OTHER PUBLICATIONS

U.S. Appl. No. 16/669,599, filed Oct. 31, 2019, Transistors With Back-Side Contacts to Create Three Dimensional Memory and Logic.

U.S. Appl. No. 16/689,789, filed Nov. 20, 2019, Three-Dimensional Memory Arrays With Layer Selector Transistors.

U.S. Appl. No. 16/691,163, filed Nov. 21, 2019, Three-Dimensional Nanoribbon-Based Dynamic Random-Access Memory.

U.S. Appl. No. 16/715,135, filed Dec. 16, 2019, Three-Dimensional Nanoribbon-Based Logic.

U.S. Appl. No. 16/724,691, filed Dec. 23, 2019, Dense Memory Arrays Utilizing Access Transistors With Back-Side Contacts.

U.S. Appl. No. 16/806,283, filed Mar. 2, 2020, Three-Dimensional Nanoribbon-Based Static Random-Access Memory.

U.S. Appl. No. 16/884,524, filed May 27, 2020, Three-Dimensional Nanoribbon-Based Two-Transistor Memory Cells.

U.S. Appl. No. 17/210,836, filed Mar. 24, 2021, Integrated Circuit Assemblies.

U.S. Appl. No. 17/323,425, filed May 18, 2021, Three-Dimensional Monolithically Integrated Nanoribbon-Based Memory and Compute.

U.S. Appl. No. 17/347,735, filed Jun. 15, 2021, Three-Dimensional Transistor Arrangements With Recessed Gates.

U.S. Appl. No. 16/043,548, filed Jul. 24, 2018, Stacked Thin-Film Transistor Based Embedded Dynamic Random-Access Memory.

Extended European Search Report in European Patent Application 22159492.2 dated September 9., 2022, 9 pages.

Extended European Search Report in European Patent Application 22171244.1 dated Oct. 19, 2022, 8 pages.

* cited by examiner

VERTICALLY STACKED AND BONDED MEMORY ARRAYS

TECHNICAL FIELD

This disclosure relates generally to the field of integrated circuit (IC) structures and devices, and more specifically, to vertically stacked and bonded memory arrays incorporated in such IC structures and devices.

BACKGROUND

Memory arrays are typically formed over a relatively thick support structure, e.g., a semiconductor wafer. For example, access transistors for memory cells are often implemented as front end of line (FEOL) transistors on an upper-most layer of a semiconductor substrate. It is challenging to increase memory density with FEOL transistors. Decreasing critical dimensions of the memory cells requires increasing complexity and cost. Another option, processing an additional memory layer on top of a lower layer memory cells, may damage the lower level of memory cells.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
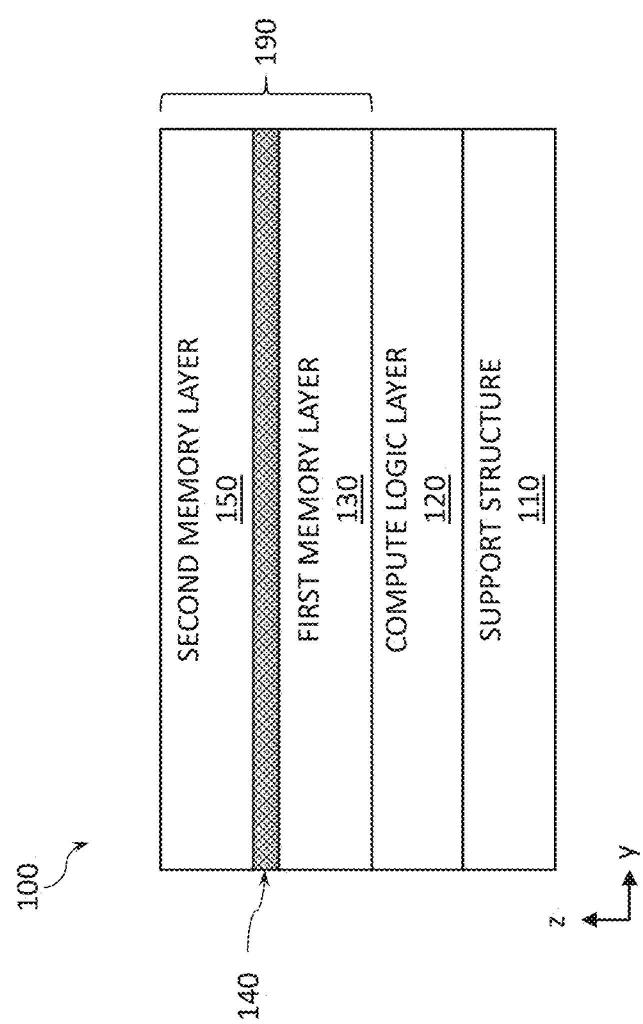
FIG. 1 is a schematic illustration of an IC device with multiple layers of memory and logic that may include a vertically stacked and bonded memory array, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to dynamic random-access memory (DRAM) and in particular, embedded DRAM (eDRAM), because this type of memory has been introduced in the past to address the limitation in density and standby power of some other types of memory devices. However, embodiments of the present disclosure may be equally applicable to memory cells implemented other technologies. Thus, in general, memory cells described herein may be implemented as eDRAM cells, spin-transfer torque random-access memory (STTRAM) cells, resistive random-access memory (RRAM) cells, or any other non-volatile memory cells.

A memory cell, e.g., an eDRAM cell, may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source/drain (S/D) region/terminal of the access transistor (e.g., to the source region of the access transistor), while the other S/D region of the access transistor may be coupled to a bit-line (BL), and a gate terminal of the transistor may be coupled to a word-line (WL). Since such a memory cell can be fabricated with as little as a single access transistor, it can provide higher density and lower standby power versus some other types of memory in the same process technology, e.g., static random-access memory (SRAM).

Various 1T-1C memory cells have, conventionally, been implemented with access transistors being front end of line (FEOL), logic-process based, transistors implemented in an upper-most layer of a semiconductor substrate. Using conventional FEOL transistors creates several challenges for increasing memory density. One challenge resides in that, given a usable surface area of a substrate, there are only so many FEOL transistors that can be formed in that area, placing a significant limitation on the density of memory cells incorporating such transistors. In conventional solutions, attempts to increase memory density have included decreasing the critical dimensions of the 1T-1C memory cells, which requires ever-increasing process complexity and cost, resulting in diminishing returns and expected slow pace of memory scaling for future nodes.

Embodiments of the present disclosure may improve on at least some of the challenges and issues described above by increasing the number of active memory layers, to generate a vertically stacked DRAM design using fewer masks and at a lower cost. Some embodiments of the present disclosure are based on sequentially stacked 1T-1C DRAM layers. In such embodiments, multiple layers of DRAM are separately fabricated. Each layer may be fabricated on a semiconductor substrate that is thinned down after the memory cells are processed. The layers of memory are then sequentially stacked and bonded using a low-temperature bonding material, such as a bonding oxide. To control and program the memory, vias are formed through the layers of memory, including the substrates and bonding interface between adjacent layers. Because the substrates have been thinned down prior to being stacked, a via can extend through multiple layers of memory. Furthermore, for thinner substrates, a tighter via pitch (i.e., a smaller distance between neighboring vias) may be achieved. This enables adjacent rows and columns of memory cells to be closer together, and/or reduces the size of the footprint devoted to vias.

In some embodiments, the DRAM is composed of 1T-1C memory cells with the capacitor on the back-side, e.g., in the first DRAM layer, the capacitor is formed in the substrate, or in a first layer over the substrate, and the access transistor is formed over the substrate, or in a second layer over the capacitor layer. Positioning the capacitor on the back-side of the DRAM can increase the density of the DRAM. In other embodiments, the DRAM is composed of 1T-1C memory cells with the capacitor on the front-side, e.g., in the first DRAM layer, the capacitor is on the side nearer to the second DRAM layer.

Vertically stacked 3D DRAM cells may provide several advantages and enable unique architectures that were not possible with conventional, FEOL logic transistors. Incorporating multiple layers of memory in a device may allow significantly increasing density of memory devices (e.g., density of memory cells in a memory array) having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of a structure with a given density of memory and/logic devices.

A further advantage of the back-side contact transistors is that transistors may be moved to the back end of line (BEOL) layers of an advanced complementary metal oxide semiconductor (CMOS) process. Moving access transistors of memory cells to the BEOL layers means that their corresponding capacitors can be implemented in the upper metal layers with correspondingly thicker interlayer dielectric (ILD) and larger metal pitch to achieve higher capacitance, which may ease the integration challenge introduced by embedding the capacitors. Furthermore, by embedding at least some, but preferably all, of the access transistors and the corresponding capacitors in the upper metal layers (i.e., in layers away from the support structure) according to at least some embodiments of the present disclosure, the peripheral circuits that control the memory operation can be hidden below the memory area to substantially reduce the memory macro array (i.e., the footprint area in the x-y plane of an example coordinate system shown in the drawings of the present disclosure).

As the foregoing illustrates, vertically stacked and bonded memory arrays as described herein may be used to address the scaling challenges of conventional 1T-1C memory technology and enable high density embedded memory compatible with an advanced CMOS process. Other technical effects will be evident from various embodiments described here.

In some embodiments, the access transistors have a recessed gate, where the gate is formed in a recess of a channel material. For example, the transistors include a fin-shaped channel material having a longitudinal structure that extends parallel to an upper face of a support structure, e.g., a substrate. For each transistor, the channel material has a recessed portion, so that some part of the channel material extends higher than the recessed portion in a direction away from the support structure. Two source/drain (S/D) regions are formed in or on the channel material. A first S/D region is formed on a portion of the channel material that extends above the recessed portion, relative to the support structure. The second S/D region may be located on another portion of the channel material that extends above the recessed portion, i.e., on the other side of the recessed portion, so that both S/D regions are on a front-side of the channel material. Alternatively, the second S/D region may be located on the side of the channel material closer to the support structure, i.e., on the back-side.

A gate stack extends over the channel material and through the recessed portion. Unlike a traditional fin field-effect transistor (FinFET), where the gate stack is formed over the fin and is higher than the S/D regions relative to the support structure, in the recessed gate structure, the portion of the gate stack extending over the channel portion is closer to the support structure than the first S/D region. In a traditional FinFET, the shortest distance between the two S/D regions is a straight line that extends directly under the gate. Recessing the gate in the channel material extends the distance between the S/D regions, which reduces the leakage current between the S/D regions. For example, if the two S/D regions are both formed on the front-side of the device, the shortest path between the S/D regions is a "U" shape, with the gate stack extending through the center of the "U".

In some embodiments, the gate fills a portion of the recess, leaving a gap between the gate and the first S/D region (and, in some embodiments, the second S/D region). In a typical FinFET structure, the channel region is directly under the gate stack, and the S/D regions are directly next to the gate stack and may extend underneath the gate stack. In this arrangement, the S/D regions may only be separated from the gate electrode by a thin layer of gate oxide, which can lead to higher leakage currents. By contrast, leaving a gap between the gate and the S/D regions helps reduce leakage currents. In other embodiments, the gate may fill the full recess, and in some embodiments, extend above the S/D regions. Extending the gate to the S/D regions reduces contact resistance, which makes it easier to turn on the transistor.

The vertically stacked and bonded memory arrays described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "logic state" of a ferroelectric memory cell refers to one of a finite number of states that the cell can have, e.g. logic states "1" and "0," each state represented by a different polarization of the ferroelectric material of the cell. In another example, as used herein, a "READ" and "WRITE" memory access or operations refer to, respectively, determining/sensing a logic state of a memory cell and programming/setting a logic state of a memory cell. In other examples, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. In yet another example, a "high-k dielectric" refers to a material having a higher dielectric constant (k) than silicon oxide. The terms "oxide," "carbide," "nitride," etc. refer to compounds containing, respectively, oxygen, carbon, nitrogen, etc.

Example IC with Vertically Stacked and Bonded Memory Layers

FIG. 1 provides a schematic illustration of an IC device 100 with logic and multiple memory layers that may be sequentially stacked and bonded, according to some embodiments of the present disclosure. As shown in FIG. 1, in general, the IC device 100 may include a support structure 110, a compute logic layer 120, and a memory array 190 that includes a first memory layer 130 and a second memory layer 150.

The second memory layer 150 is bonded to the first memory layer 130 at a bonding interface 140 that includes a bonding material. The bonding interface 140 may further include signal and/or power interconnects between the first memory layer 130 and the second memory layer 150. The memory array 190 may include additional memories stacked above the second memory layer 150 and connected in a similar manner, e.g., a third memory layer may be stacked above the second memory layer 150 and bonded to the second memory layer 150 by a second bonding interface similar to the bonding interface 140. The first memory layer 130 may be bonded to the compute logic layer by an additional bonding interface.

Implementations of the present disclosure may be formed or carried out on the support structure 110, which may be, e.g., a substrate, a die, a wafer or a chip. The support structure 110 may, e.g., be the wafer 1500 of FIG. 13A, discussed below, and may be, or be included in, a die, e.g., the singulated die 1502 of FIG. 13B, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the vertically stacked and bonded memory arrays as described herein may be built falls within the spirit and scope of the present disclosure.

The first and second memory layers 130, 150 may, together, be seen as forming a memory array 190. As such, the memory array 190 may include access transistors, capacitors, as well as wordlines (e.g., row selectors) and bitlines (e.g., column selectors), making up memory cells. On the other hand, the compute logic layer 120 may include various logic layers, circuits, and devices (e.g., logic transistors) to drive and control a logic IC. For example, the logic devices of the compute logic layer 120 may form a memory peripheral circuit to control (e.g., access (read/write), store, refresh) the memory cells of the memory array 190.

In some embodiments, the compute logic layer 120 may be provided in a FEOL layer with respect to the support structure 110. In some embodiments, the compute logic layer 120 may be provided in a FEOL and in one or more lowest BEOL layers (i.e., in one or more BEOL layers which are closest to the support structure 110), while the first memory layer 130 and the second memory layer 150 may be seen as provided in respective BEOL layers. Various BEOL layers may be, or include, metal layers. Various metal layers of the BEOL may be used to interconnect the various inputs and outputs of the logic devices in the compute logic layer 120 and/or of the memory cells in the memory layers 130, 150. In particular, these metal layers may connect to through-silicon vias (TSVs) that couple the compute logic layer 120 to the first memory layer 130, the first memory layer 130 to the second memory layer 150, and/or the compute logic layer 120 to the second memory layer 150.

Generally speaking, each of the metal layers of the BEOL may include a via portion and a trench/interconnect portion. The trench portion of a metal layer is configured for transferring signals and power along electrically conductive (e.g., metal) lines (also sometimes referred to as "trenches") extending in the x-y plane (e.g., in the x- or y-directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), tungsten (W), or cobalt (Co), or metal alloys, or more generally, patterns of an electrically conductive material, formed in an insulating medium such as an ILD. The insulating medium may include any suitable ILD materials such as silicon oxide, carbon-doped silicon oxide, silicon carbide, silicon nitride, aluminum oxide, and/or silicon oxynitride.

As noted above, the vias may include power vias for transferring power between layers and signal vias for transferring data signals between layers. In general, cross-sectional dimensions (e.g., diameters) and a pitch (e.g., defined as a center-to-center distance) of power vias are larger than cross-sectional dimensions and a pitch of signal vias. After vias are formed in a particular IC structure (e.g., the compute logic layer 120 or the first memory layer 130), the faces of the IC structures that are joined at the bonding interface may be grinded so that electrical connections can be made between vias of adjoining IC structures. Grinding a face of an IC structure to reveal the vias may be performed using any suitable thinning/polishing processes as known in the art.

The first memory layer 130 is physically bonded to the second memory layer 150 at the bonding interface 140. Additional memory layers may be sequentially bonded, e.g., above the second memory layer 150. For example, an upper face of the first memory layer 130 (e.g., the face opposite the support structure 110) is bonded to a lower face of the second memory layer 150. The bonding may be performed using insulator-insulator bonding, e.g., as oxide-oxide bonding, where an insulating material of a first IC structure (e.g., the first memory layer 130) is bonded to an insulating material of a second IC structure (e.g., the second memory layer 150). In some embodiments, a bonding material may be present in between the faces of the first and second IC structures that are bonded together. To bond two IC structures together, the bonding material may be applied to one or both faces of the first and second IC structures that should be bonded. For example, the bonding material making up the bonding interface 140 is applied to the upper face of the first memory layer 130 and/or the lower face of the second memory layer 150. After the bonding material is applied, the first and second IC structures are put together, possibly while applying a suitable pressure and heating up the assembly to a suitable temperature (e.g., to relatively low temperatures, e.g., between about 50 and 200 degrees Celsius) for a duration of time. In some embodiments, the bonding material may be an adhesive material that ensures attachment of the first and second IC structures to one another. In some embodiments, the bonding material may be an etch-stop material. In some embodiments, the bonding material may be both an etch-stop material and have suitable adhesive properties to ensure attachment of the first and second IC structures to one another.

In some embodiments, the bonding material may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, could be a characteristic feature of the hybrid bonding. Using an etch-stop material at a bonding interface that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the first and second IC structures together. In addition, an etch-stop material at the interface between the first and second IC structures that includes include silicon, nitrogen, and carbon, where the atomic percentage of any of these materials may be at least 1%, may be advantageous in terms of improving etch-selectivity of this material with respect to etch-stop materials that may be used in different of the first and second IC structures.

In some embodiments, no bonding material may be used, but there will still be a bonding interface resulting from the bonding of the IC structures to one another. Such a bonding interface may be recognizable as a seam or a thin layer in the microelectronic assembly, using, e.g., selective area diffraction (SED), even when the specific materials of the insulators of the first and second IC structures that are bonded together may be the same, in which case the bonding interface would still be noticeable as a seam or a thin layer in what otherwise appears as a bulk insulator (e.g., bulk oxide) layer. In different embodiments, the bonding interface 140 and bonding interfaces for additional memory layers and/or a bonding interface between the compute logic layer 120 and the first memory layer 130 may be the same or different, and the bonding process may be the same or different. For example, a first bonding material bonds the first memory layer 130 to the second memory layer 150 at the bonding interface 140, and a second, different bonding material bonds the first memory layer 130 to the compute logic layer 120.

In other embodiments of the IC device 100, compute logic devices may be provided in a layer above the memory array 190, in between memory layers 130, 150, or combined with the memory layers 130, 150. The layers of memory and compute logic devices may be bonded using a bonding interface similar to the bonding interface 140 described above.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers.

Example 1T-1C Memory Array

Figure 2:
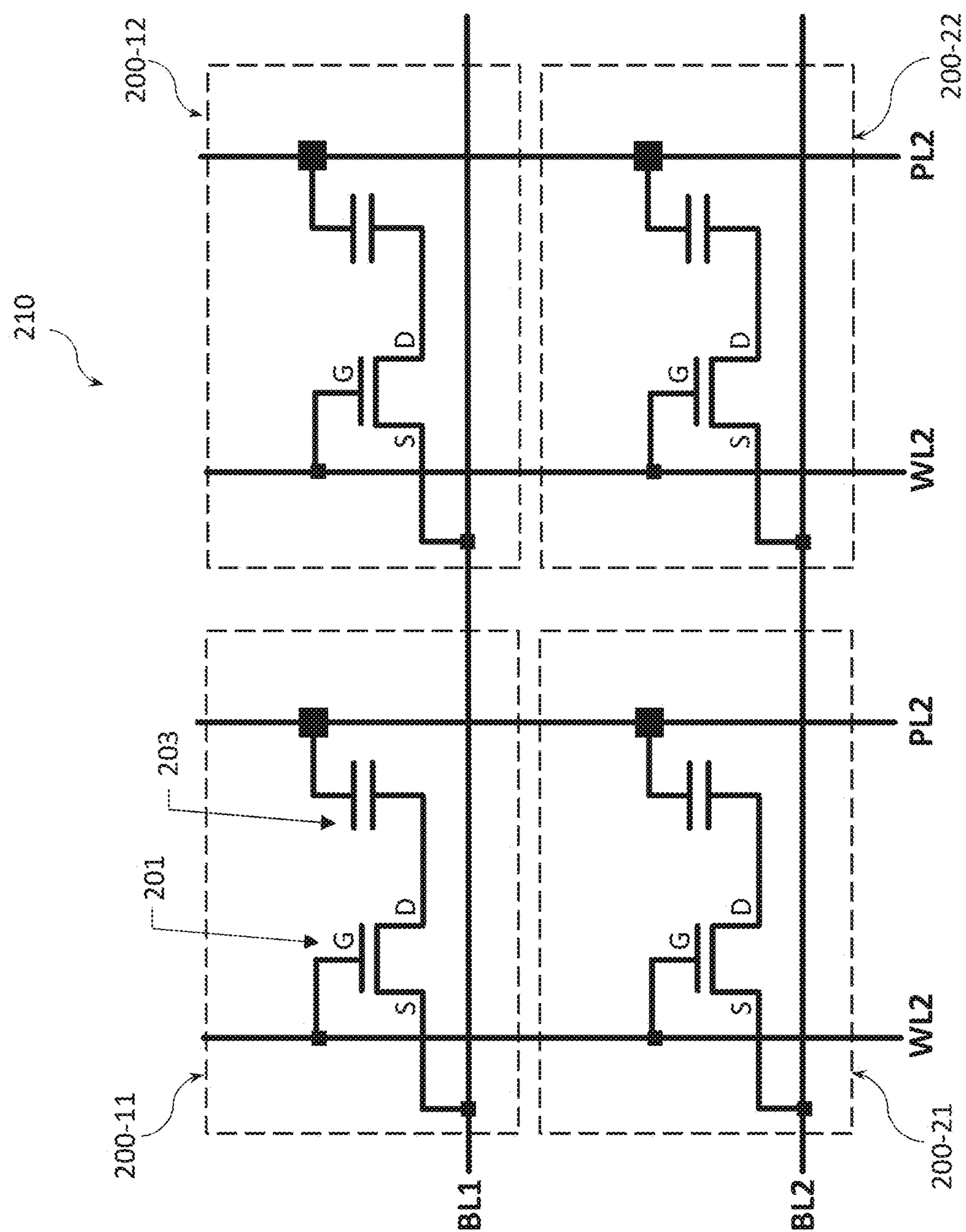
FIG. 2 is a schematic illustration of a plurality of memory cells, namely four memory cells, arranged in an array, according to some embodiments of the present disclosure.

FIG. 2 provides a schematic illustration of a plurality of 1T-1C memory cells 200, namely four cells, arranged in an array 210, according to some embodiments of the present disclosure. Each 1T-1C memory cell 200 is illustrated in FIG. 2 to be within a dashed box labeled 200-11, 200-12, 200-21, and 200-22. The 1T-1C memory cell 200-11 may include an access transistor 201 and a capacitor 203. The access transistor 201 has a gate terminal, a source terminal, and a drain terminal, indicated in the example of FIG. 2 as terminals G, S, and D, respectively. Each of the other memory cells 200-12, 200-21, and 200-22 includes a transistor and capacitor, similar to the transistor 201 and capacitor 203 and similarly arranged.

In each 1T-1C memory cell 200, the gate terminal of the access transistor 201 is coupled to a word-line (WL), one of the source or drain terminals of the access transistor 201 is coupled to a bit-line (BL), and the other one of the source or drain terminals of the access transistor 201 is coupled to a first electrode of the capacitor 203. The other electrode of the capacitor 203 is coupled to a plate-line (PL). The WL, BL, and PL are used together to read and program the capacitor 203. In the following, the electrode of the capacitor 203 coupled to the PL is referred to as a "first capacitor electrode" while the electrode of the capacitor 203 coupled to the access transistor is referred to as a "second capacitor electrode."

As is commonly known, source and drain terminals are interchangeable in transistors. Therefore, while the example of FIG. 2 illustrates that the transistor 201 is coupled to the capacitor 203 by its drain terminal, in other embodiments, any one of a source or a drain terminal of the transistor 201 may be coupled to the second electrode of the capacitor 203. A source and a drain terminal of a transistor is sometimes referred to in the following as a "transistor terminal pair" and a "first terminal" of a transistor terminal pair is used to describe, for the access transistor 201, the terminal that is connected to the BL, while a "second terminal" is used to describe the source or drain terminal of the access transistor that is connected to the second capacitor electrode of the capacitor 203.

In various embodiments, the access transistor 201 may be any metal oxide semiconductor (MOS) transistors which include drain, source, and gate terminals. In particular embodiments of the present disclosure, the access transistor 201 is a three-dimensional transistor with a recessed gate, such as any of the transistors illustrated in FIGS. 3-11.

While the array 210 shown in FIG. 2 has four such memory cells 200, in other embodiments, the array 210 may, and typically would, include many more memory cells. Furthermore, in other embodiments, the 1T-1C memory cells as described herein may be arranged in arrays in other manners as known in the art, all of which being within the scope of the present disclosure.

FIG. 2 illustrates that BL can be shared among multiple memory cells 200 in a column, and that WL and PL can be shared among multiple memory cells 200 in a row. As is conventionally used in context of memory, the terms "row" and "column" do not reflect the, respectively, horizontal and vertical orientation on a page of a drawing illustrating a memory array but, instead, reflect on how individual memory cells are addressed. Namely, memory cells 200 sharing a single BL are said to be in the same column, while memory cells 200 sharing a single WL are said to be on the same row. Thus, in FIG. 2, the horizontal lines refer to columns while vertical lines refer to rows. Different instances of each line (BL, WL, and PL) are indicated in FIG. 2 with different reference numerals, e.g. BL1 and BL2 are the two different instances of the BL as described herein. The same reference numeral on the different lines WL and PL indicates that those lines are used to address/control the memory cells in a single row, e.g. WL1 and PL1 are used to address/control the memory cells 200 in row 1, and so on. Each memory cell 200 may then be addressed by using the BL corresponding to the column of the cell and by using the WL and PL corresponding to the row of the cell. For example, the memory cell 200-11 is controlled by BL1, WL1, and PL1, the memory cell 200-12 is controlled by BL1, WL2, and PL2, and so on.

Example Three-Dimensional Transistor with Recessed Gate

Figure 3:
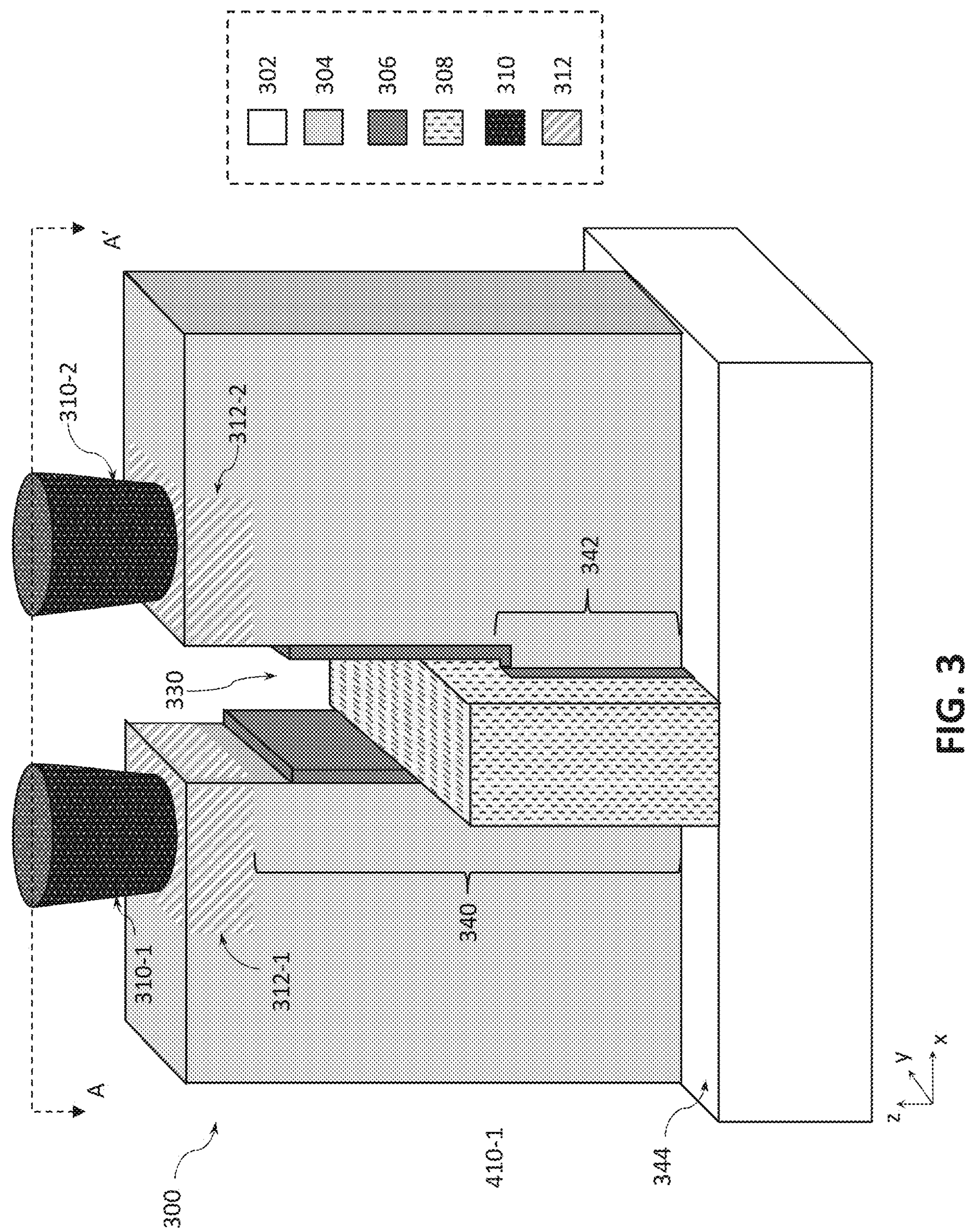
FIG. 3 is a perspective view of an example three-dimensional transistor with a recessed gate, according to some embodiments of the present disclosure.

In a conventional FinFET, a channel region extends straight under a gate stack, such that the shortest path between the source and drain regions is a straight line directly under the gate oxide. Lengthening the path between the source and drain regions, e.g., moving the source and drain regions further apart, can reduce leakage current. While a conventional FinFET could be stretched in the direction of the fin to increase the channel length, this would increase the size of the transistor and, in an IC device consisting of many such transistors, would reduce transistor density across the device, which is undesirable. A three-dimensional transistor with a recessed gate, such as the transistor arrangement shown in FIG. 3, provides a longer channel length between a source and drain region while maintaining transistor density across a device. The recessed gate structure results in a longer path between the source and drain regions, which reduces leakage current.

FIG. 3 is a perspective view of an example three-dimensional transistor 300 with a recessed gate, according to some embodiments of the present disclosure. As shown, the transistor 300 is formed on a support structure 302, and the transistor 300 includes a channel material 304, a gate stack comprising a gate dielectric 306 (which could include a stack of one or more gate dielectric materials), and a gate electrode 308 (which could include a stack of one or more gate electrode materials). The channel material 304 has a recess 330, and the gate stack extends through the recess 330. In this example, two source/drain (S/D) regions 312 are formed on either side of the recess 330 and above the gate electrode 308. A pair of contact electrodes 310 are coupled to the S/D regions 312.

A number of elements referred to in the description of FIGS. 3-12 with reference numerals are illustrated in these figures with different patterns, with a legend showing the correspondence between the reference numerals and patterns being provided at the bottom or side of each drawing page containing FIGS. 3-12. For example, the legend in FIG. 3 illustrates that FIG. 3 uses different patterns to show a support structure 302, a channel material 304, a gate dielectric 306, a gate electrode 308, a contact electrode 310, and a S/D region 312.

The support structure 302 may include any such substrate that provides a suitable surface for providing the transistor 300. Various types of support structures are described with respect to the support structure 110. In some embodiments, one or more additional layers not shown in FIG. 3 are situated between the support structure 302 and the channel material 304. In some embodiments, the support structure 302 for the transistor 300 is different from but similar to the support structure 110, e.g., the compute logic layer 120 is formed on one support structure 110, and a memory layer (e.g., the first memory layer 130 and/or the second memory layer 150) include transistors, such as the transistor 300, formed on a second support structure 302 that may be similar to or different from the support structure 110.

In some embodiments, the channel material 304 may be composed of semiconductor material systems including, for example, N-type or P-type materials systems. In some embodiments, the channel material 304 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 304 may include a combination of semiconductor materials where one semiconductor material may be used for the channel portion, and another material, sometimes referred to as a "blocking material," may be used between the channel portion and the support structure 302 over which the transistor 300 is provided. In some embodiments, the channel material 304 may include a monocrystalline semiconductor, such as silicon (Si) or germanium (Ge). In some embodiments, the channel material 304 may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material 304 is an epitaxial semiconductor material deposited on the support structure 302 using an epitaxial deposition process. The epitaxial semiconductor material may have a polycrystalline structure with a grain size between about 2 nanometers and 100 nanometers, including all values and ranges therein.

For some example N-type transistor embodiments (i.e., for the embodiments where the transistor 300 is an N-type metal-oxide-semiconductor (NMOS)), the channel material 304 may advantageously include a III-V material having a high electron mobility, such as, but not limited to InGaAs, InP, InSb, and InAs. For some such embodiments, the channel material 304 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material 304 may be an intrinsic III-V material, i.e., a III-V semiconductor material not intentionally doped with any electrically active impurity. In alternate embodiments, a nominal impurity dopant level may be present within the channel material 304, for example to further fine-tune a threshold voltage Vt, or to provide HALO pocket implants, etc. Even for impurity-doped embodiments however, impurity dopant level within the channel material 304 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 300 is a P-type metal-oxide-semiconductor (PMOS)), the channel material 304 may advantageously be a group IV material having a high hole mobility, such as, but not limited to Ge or a Ge-rich SiGe alloy. For some example embodiments, the channel material 304 may have a Ge content between 0.6 and 0.9, and advantageously may be at least 0.7. In some embodiments with highest mobility, the channel material 304 may be intrinsic III-V (or IV for P-type devices) material and not intentionally doped with any electrically active impurity. In alternate embodiments, one or more a nominal impurity dopant level may be present within the channel material 304, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the transistor 300 may be a thin film transistor (TFT). A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. If the transistor 300 is a TFT, the channel material 304 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 300 is a TFT, the channel material 304 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 304 may have a thickness between about 5 and 75 nanometers, including all values and ranges therein. In some embodiments, a thin film channel material 304 may be deposited at relatively low temperatures, which allows depositing the channel material 304 within the thermal budgets imposed on back end fabrication to avoid damaging other components, e.g., front end components such as the logic devices.

The channel material 304 has a fin shape that extends away from the support structure 302 in a direction substantially perpendicular to the support structure 302, i.e., perpendicular to the upper face 344 of the support structure 302 and extending in the z-direction in the exemplary reference coordinate system x-y-z shown in FIG. 3. The channel material 304 further has a longitudinal structure extending in a direction parallel to a plane of the support structure 302, e.g., parallel to the upper face 344 of the support structure 302 and extending in the x-direction in the exemplary reference coordinate system x-y-z shown in FIG. 3. The fin may extend further in the x-direction than shown in FIG. 3; for example, many transistors similar to the transistor 300 may be formed along a fin that extends in the x-direction. Channel material 304 for individual transistors may be formed from the fin, e.g., portions of the fin for different transistors may be individuated by patterning and etching the fin, and depositing an ILD material between the portions.

As shown in FIG. 3, a recess 330 extends into the channel material 304 in the z-direction. The recess 330 does not extend all the way through the channel material 304 in the z-direction, i.e., the recess 330 does not extend down to the support structure 302. The recess 330 extends through the channel material 304 in the y-direction. The recess 330 may be formed in the channel material 304 using an etching process. For example, the channel material 304 may be patterned using any suitable patterning techniques, e.g., photolithographic or electron-beam patterning, possibly in combination with using a mask, e.g., a hardmask, and a suitable etching process is used to remove portions of the channel material 304, e.g., using dry etch, wet etch, reactive ion etch (RIE), ion milling, etc. In some embodiments, an ILD layer (not shown in FIG. 3) is deposited over the patterned channel material 304, and the ILD layer is patterned prior to etching. In such embodiments, the ILD layer is etched, and then the recess 330 in the channel material 304 is etched. In some embodiments, a mask layer is between the channel material 304 and the ILD layer; in such embodiments, the ILD layer is etched, and then the mask layer (which may have been previously patterned) is etched, and then the channel material 304 is etched to form the recess 330.

Figure 4:
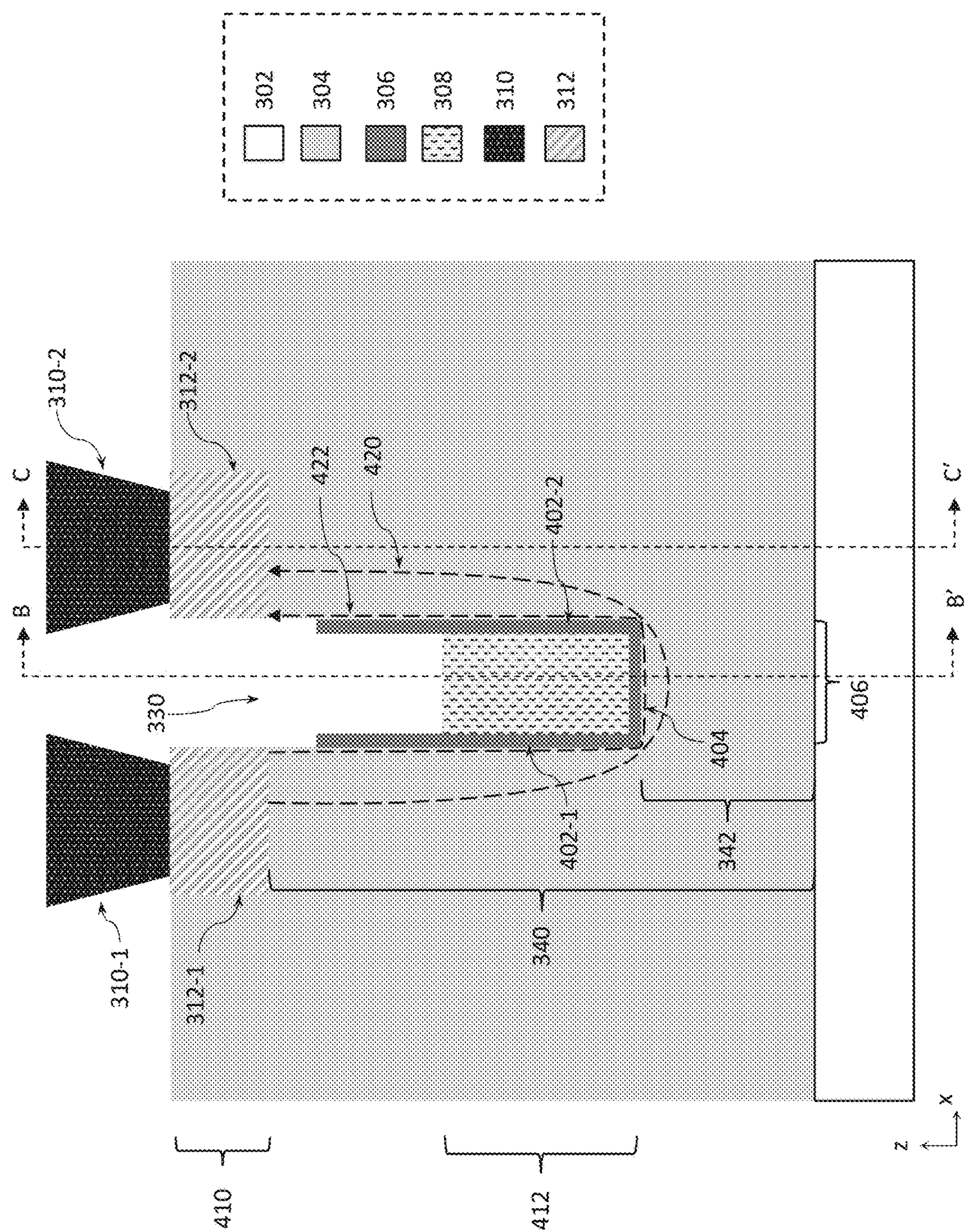
FIG. 4 is a cross-sectional view along a plane AA' of the example arrangement shown in FIG. 3, according to some embodiments of the present disclosure.

FIG. 4 illustrates a cross-sectional side view in the x-z plane of the example coordinate system x-y-z shown in FIG. 3, with the cross section of FIG. 4 taken across the fin of channel material 304 (e.g., along the plane shown in FIG. 3 as a plane AA'). As shown in FIG. 4, the recess 330 includes two sidewalls 402-1 and 402-2, and a base 404. While the sidewalls 402 and base 404 are illustrated as being at right angles with sharp corners, the cross-sectional shape of the recess 330 may have a different shape, e.g., the base 404 or a portion of the base 404 may be curved, e.g., the base 404 has a semicircular cross section connected to straight sidewalls 402-1 and 402-2, or the recess 330 has a parabolic cross section with a lower portion of the parabola referred to as the base 404 and the upper portions of the parabola referred to as the sidewalls 402

FIG. 4 also illustrates a portion 406 of the channel material 304 is under the recess 330. This portion 406 is situated between the gate stack (specifically, the portion of the gate stack that extends over the channel material 304) and the support structure 302.

Figure 5:
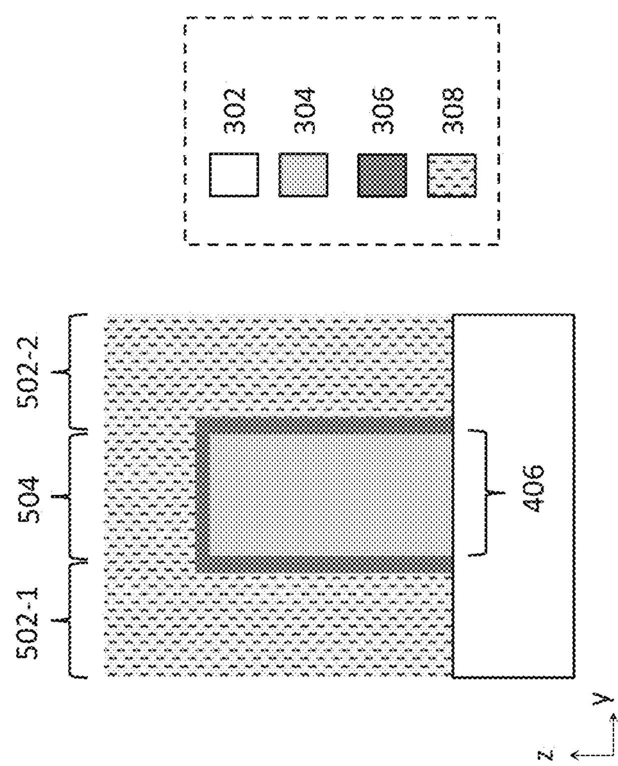
FIG. 5 is a cross-sectional view along a plane BB' of the example arrangement shown in FIG. 4, according to some embodiments of the present disclosure.

Returning to FIG. 3, the gate stack extends through the recess 330 in the y-direction. The gate stack wraps around the channel material 304, so that one portion of the gate stack on either side of the channel material 304 is directly over the support structure 302, without the channel material 304 between these portions of the gate stack and the support structure 302. FIG. 5 illustrates a cross-sectional view in the y-z plane of the example coordinate system shown in FIG. 3, with the cross section taken along the gate stack (e.g., along the plane shown in FIG. 4 as a plane BB'). FIG. 5 illustrates three portions of the gate stack: two portions 502-1 and 502-2 on either side of the channel material 304, and another portion 504 over the portion 406 of the channel material described above and illustrated in the x-z plane in FIG. 4. The portion 504 of the gate stack extending over the portion 406 of the channel material 304 is situated in the recess 330.

The gate stack includes a gate dielectric 306 and a gate electrode 308. In some embodiments, the gate dielectric 306 may include one or more high-k dielectrics. Examples of high-k materials that may be used in the gate dielectric 306 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. The gate dielectric 306 may be deposited using a conformal deposition process, such as atomic layer deposition (ALD) or chemical vapor deposition (CVD). Conformal deposition generally refers to deposition of a certain coating on any exposed surface of a given structure. A conformal coating may, therefore, be understood as a coating that is applied to exposed surfaces of a given structure, and not, for example, just to the horizontal surfaces. In some embodiments, an annealing process may be carried out on the gate dielectric 306 during manufacture of the transistor 300 to improve the quality of the gate dielectric 306. The gate dielectric 306 may have a thickness, a dimension measured in the direction of the y-axis of the reference coordinate system x-y-z shown in FIG. 3, that may, in some embodiments, be between 0.5 nanometers and 20 nanometers, including all values and ranges therein (e.g., between 2 and 6 nanometers).

The gate electrode 308 may include at least one P-type work function metal or N-type work function metal, depending on whether the transistor 300 is a PMOS transistor or an NMOS transistor (P-type work function metal used as the gate electrode 308 when the transistor 300 is a PMOS transistor and N-type work function metal used as the gate electrode 308 when the transistor 300 is an NMOS transistor). For a PMOS transistor, metals that may be used for the gate electrode 308 may include, but are not limited to, ruthenium, palladium, platinum, cobalt, nickel, and conductive metal oxides (e.g., ruthenium oxide). For an NMOS transistor, metals that may be used for the gate electrode 308 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 308 may consist of a stack of two or more metal layers, where one or more metal layers are work function metal layers and at least one metal layer is a fill metal layer. Further layers may be included next to the gate electrode 308 for other purposes, such as to act as a diffusion barrier layer or/and an adhesion layer.

In the example shown in FIGS. 3-5, the gate stack extends partway up the recess 330, with a gap between the top of the gate stack and the top of the channel material 304. As illustrated in FIG. 4, the gate dielectric 306 is deposited along the base 404 and along a portion of each of the two sidewalls 402-1 and 402-2. The gate electrode 308 is deposited within the recess 330, with the gate dielectric 306 between the gate electrode 308 and the channel material 304. In the example of FIGS. 3-5, the gate dielectric 306 extends up the sidewalls 402-1 and 402-2 in the z-direction towards the S/D regions 312, but not reaching the S/D regions 312. The gate electrode 308 and gate dielectric 306 may have different heights, and different relative heights in the z-direction, than the example shown in FIGS. 3 and 4 as long as the gate dielectric 306 is between the gate electrode 308 and the channel material 304, so that the gate electrode 308 is not in contact with the channel material 304 and/or S/D regions 312. For example, the gate dielectric 306 and gate electrode 308 may both extend in the z-direction up to the base of the S/D regions 312. In another example, the gate dielectric 306 and gate electrode 308 extend along the full length of the sidewalls 402 to a top face of the channel material 304. In some embodiments, the gate electrode 308 further extends above the top face of the channel material 304.

Figure 6:
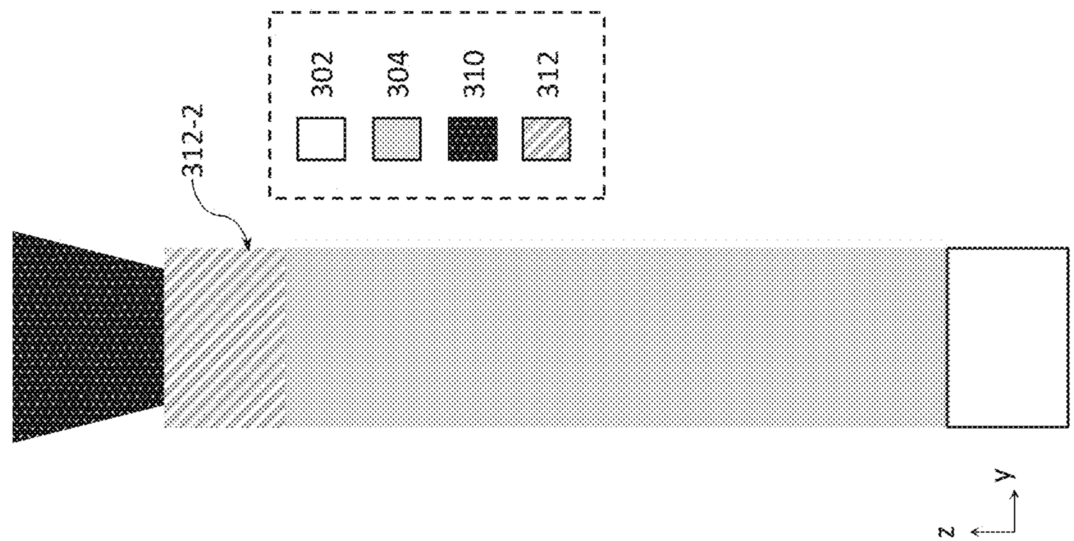
FIG. 6 is a cross-sectional view along a plane CC' of the example arrangement shown in FIG. 4, according to some embodiments of the present disclosure.

Returning to FIG. 3, two S/D regions 312-1 and 312-2 (together referred to as "S/D regions 312") are situated on either side of the recess 330, along the top of the channel material 304. Two S/D contact electrodes 310-1 and 310-2 (together referred to as "contact electrodes 310" or "S/D contact electrodes 310"), formed of one or more electrically conductive materials, may be used for providing electrical connectivity to the S/D regions 312-1 and 312-2, respectively. FIG. 6 illustrates a second cross-sectional view in the y-z plane of the example coordinate system shown in FIG. 3, with the cross section taken along the second S/D region 312-2 and S/D contact electrode 310-2 (e.g., along the plane shown in FIG. 4 as a plane CC').

The S/D regions 312 may generally be formed using either an implantation/diffusion process or an etching/deposition process. In the former process, dopants such as boron, aluminum, antimony, phosphorous, or arsenic may be ion-implanted into the channel material to form the source and drain regions. An annealing process that activates the dopants and causes them to diffuse further into the channel material 304 typically follows the ion implantation process. In the latter process, the channel material 304 may first be etched to form recesses at the locations of the source and drain regions. An epitaxial deposition process may then be carried out to fill the recesses with material that is used to fabricate the source and drain regions. In some implementations, the S/D regions 312 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 312 may be formed using one or more alternate semiconductor materials such as germanium or a group III-V material or alloy. And in further embodiments, one or more layers of metal and/or metal alloys may be used to form the S/D regions 312.

In various embodiments, one or more layers of metal and/or metal alloys may be used to form the S/D contact electrodes 310. For example, the electrically conductive materials of the S/D contact electrodes 310 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contact electrodes 310 may include one or more electrically conductive alloys, oxides, or carbides of one or more metals. In some embodiments, the S/D contact electrodes 310 may include a doped semiconductor, such as silicon or another semiconductor doped with an N-type dopant or a P-type dopant. Metals may provide higher conductivity, while doped semiconductors may be easier to pattern during fabrication. Although FIG. 3 illustrates the first and second S/D contact electrodes 310 with a single pattern, suggesting that the material composition of the first and second S/D contact electrodes 310 is the same, this may not be the case in some other embodiments of the transistor 300. Thus, in some embodiments, the material composition of the first S/D contact electrode 310-1 may be different from the material composition of the second S/D contact electrode 310-2.

Figure 9:
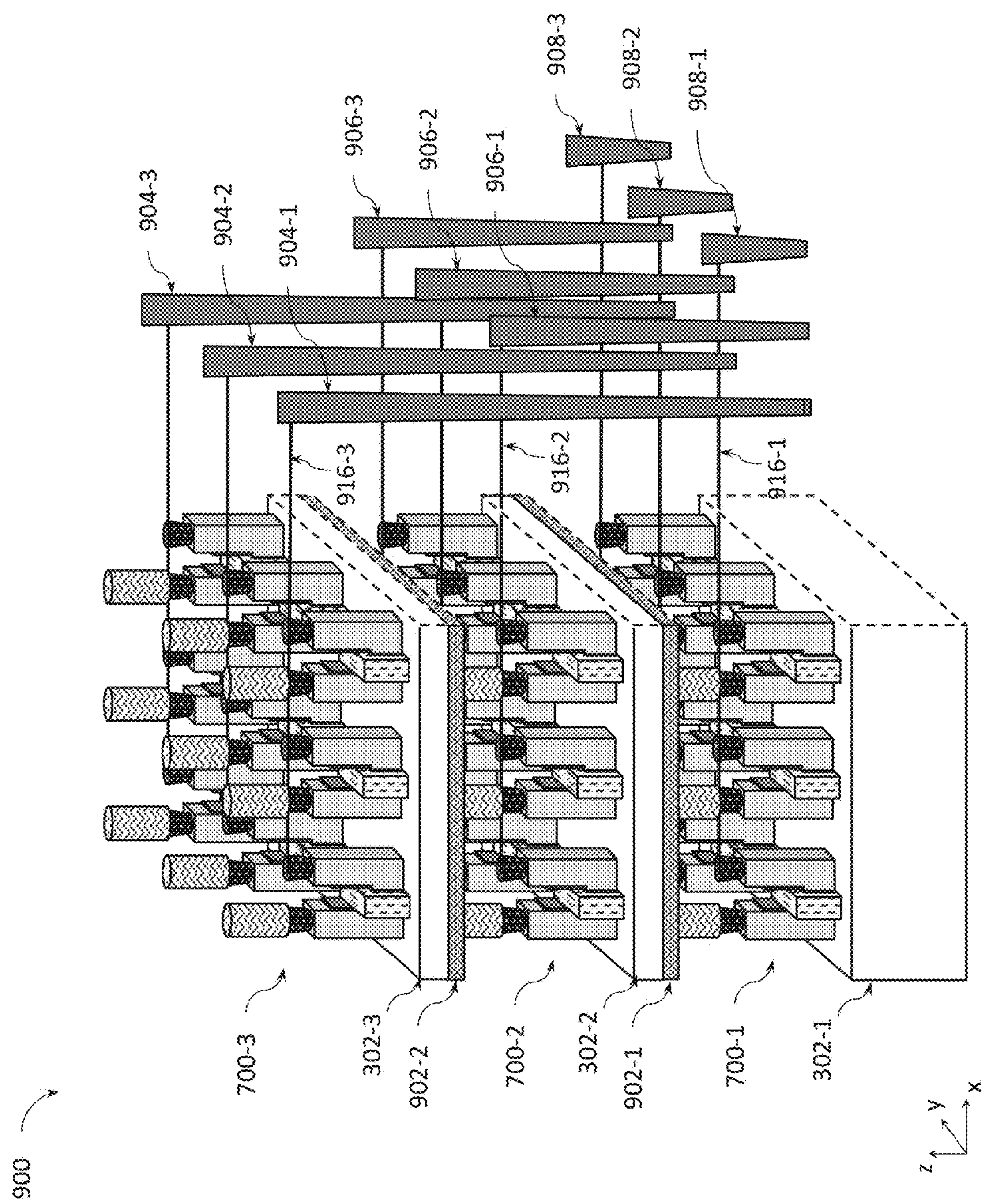
FIG. 9 is a perspective view of an example vertically stacked and bonded memory array with a different via configuration, according to some embodiments of the present disclosure.

As shown in FIG. 4, the S/D regions 312 are located in one layer 410 of the device, above a second layer 412 of the device that includes the portion 504 of the gate stack extending over the portion 406 of the channel material. Both layers 410 and 412 are over the support structure 302, and the second layer 412 is situated between the support structure 302 and the first layer 410. In an alternate embodiment, one of the S/D regions may be formed on the back-side, and coupled to a back-side contact. An example of such an embodiment is shown in FIG. 9.

FIGS. 3 and 4 illustrate two distances 340 and 342, where the first distance 340 is a distance from the first S/D region 312-1 and the support structure 302, and the second distance 342 is a distance from the portion of the gate stack situated over the channel material 304 (i.e., the portion 504 of the gate stack) to the support structure 302. The second distance 342 is smaller than the first distance 340, i.e., the distance from the support structure 302 to the portion of the gate stack over the channel material is smaller than the distance from the support structure 302 to the first S/D region 312-1. In this example, with two front-side contacts, the distance from the second S/D region 312-2 to the support structure 302 is the same as the first distance 340. The first distance 340 may have a length between about 20 nanometers to 400 nanometers, including all values and ranges therein, e.g., between about 40 nanometers and 60 nanometers. The second distance 342 may have a length between about 3 nanometers to 100 nanometers, including all values and ranges therein, e.g., between about 3 nanometers and 10 nanometers.

FIG. 4 further illustrates two example paths 420 and 422 between the S/D regions 312-1 and 312-2. The paths 420 and 422 are example current pathways between the S/D regions 312. The path 420 may represent a typical path, extending down from the first S/D region, around the recess 330, and up to the second S/D region 312-2. The path 422 represents a shortest path between the two S/D regions 312, extending from the first S/D region 312-1 down the first sidewall 402-1, across the base 404, up the second sidewall 402-2, and to the second S/D region 312-2. The direction of current may be the opposite of the direction shown in FIG. 4, i.e., current may alternatively travel from the second S/D region 312-2 to the first S/D region 312-1.

As illustrated in FIG. 4, the paths 420 and 422, and in particular, the shortest path 422, is not a straight line. Instead, the shortest path 422 has a "U" shape that extends around the recess 330. This is in contrast to the shortest path of a conventional FinFET, which is a straight line directly under the gate oxide.

The arrangement shown in FIG. 3 (and other figures of the present disclosure) is intended to show relative arrangements of some of the components therein, and that the arrangement with the transistor 300, or portions thereof, may include other components that are not illustrated. For example, although not specifically illustrated in FIG. 3, a dielectric spacer may be provided between one or both of the S/D contact electrodes 310 and the gate electrode 308 in order to provide additional electrical isolation between the source, gate, drain electrodes. In another example, although not specifically illustrated in FIG. 3, at least portions of the transistor 300 may be surrounded in an insulator material, such as any suitable ILD material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 300 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Example Single-Layer Memory Array

Figure 7:
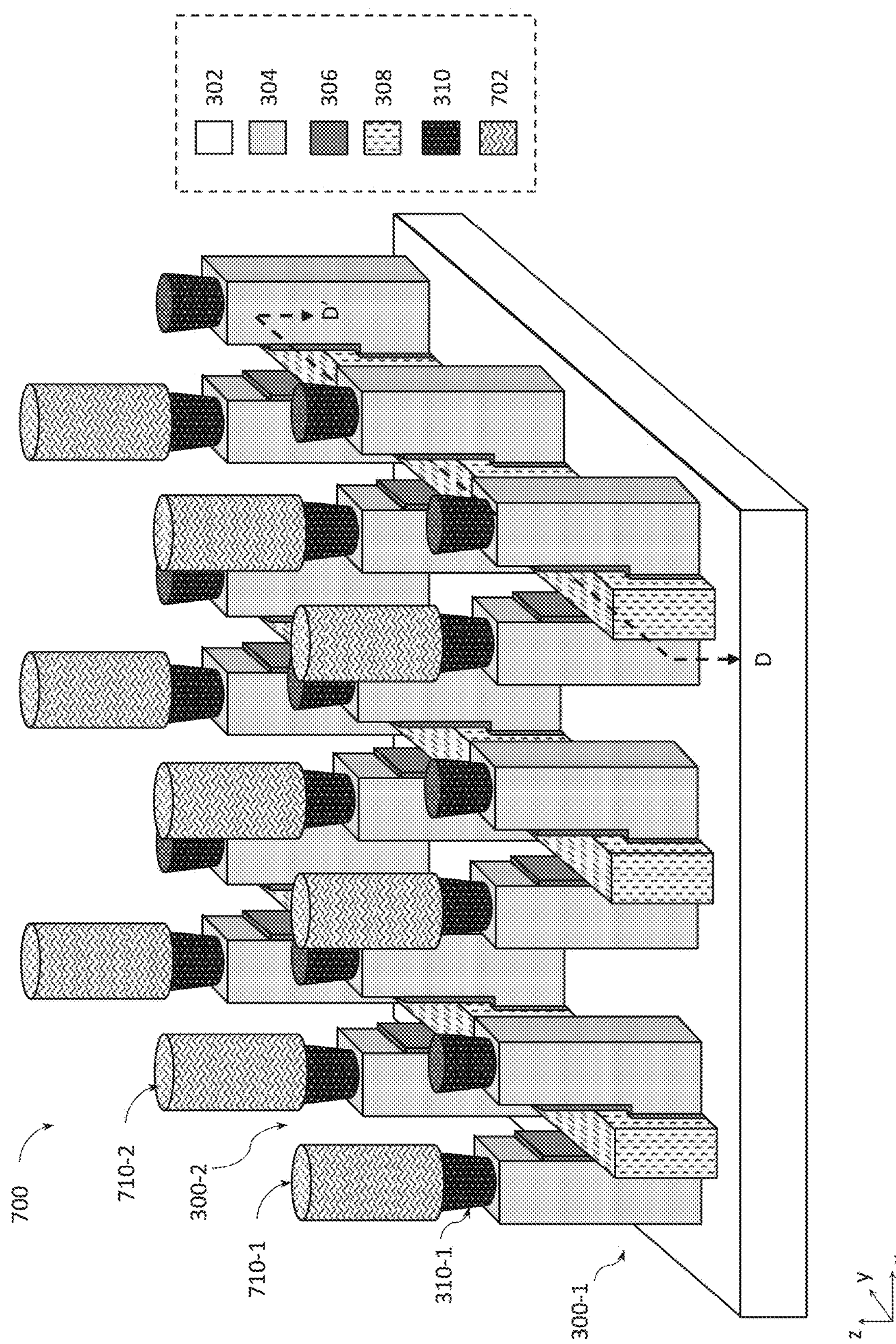
FIG. 7 is a perspective view of an example array of memory cells that include three-dimensional transistors with recessed gates, according to some embodiments of the present disclosure.

FIG. 7 is a perspective view of an example array 700 of 1T-1C memory cells that include three-dimensional transistors with recessed gates, according to some embodiments of the present disclosure. The array 700 is an example implementation of the array 210 shown in FIG. 2, with nine example 1T-1C memory cells arranged in rows and columns (here, three rows and three columns). While the array 700 shown in FIG. 7 has nine memory cells, in other embodiments, the array 700 may, and typically would, include many more memory cells. Each of the memory cells includes the transistor 300 shown in FIG. 3, and a capacitor 710 represented in the legend with the pattern 702. The legend further shows the materials 302-310 shown in FIG. 3; in this illustration, the S/D regions 312 are not specifically shown.

Figure 8:
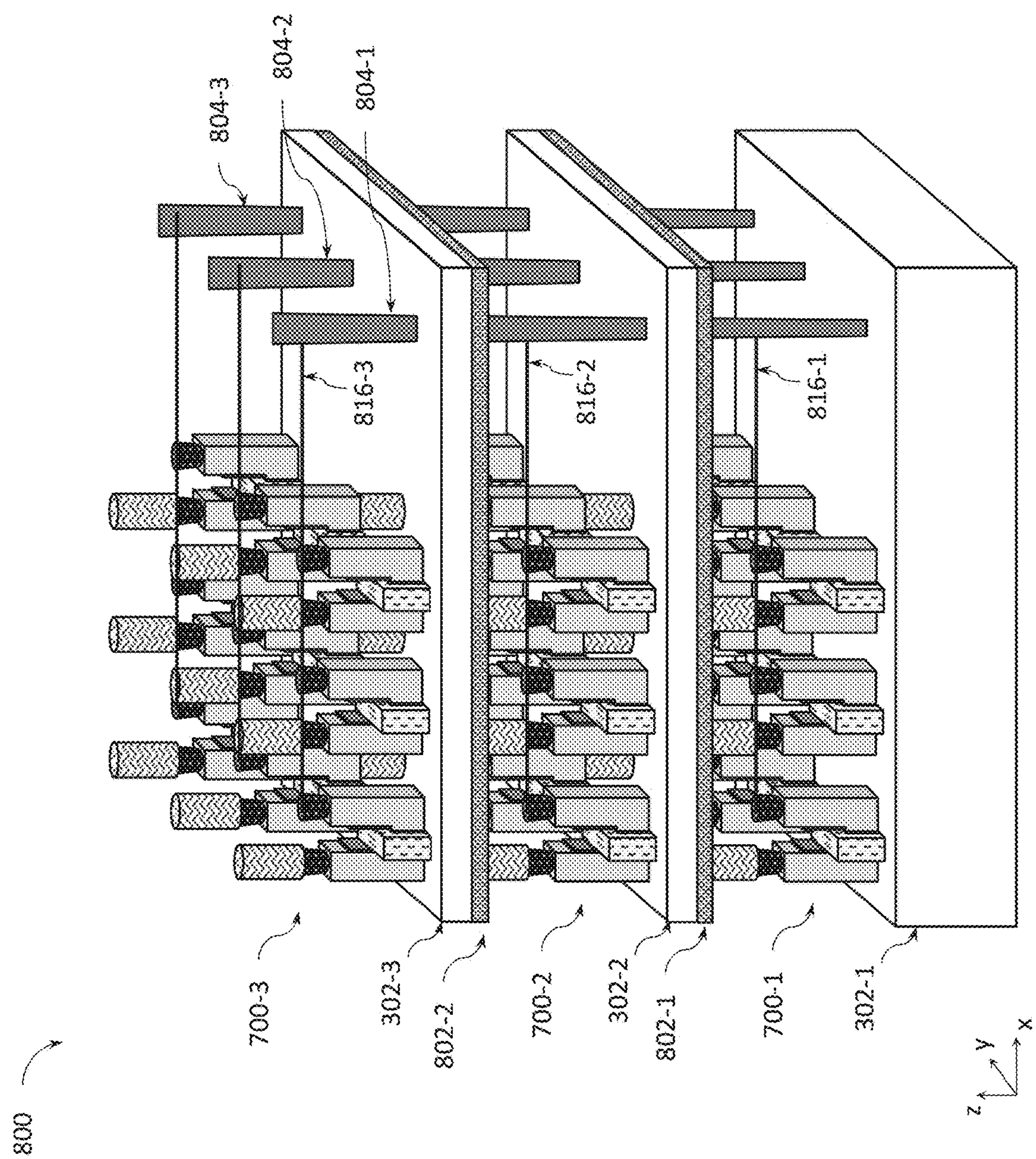
FIG. 8 is a perspective view of an example vertically stacked and bonded memory array, according to some embodiments of the present disclosure.

For example, a first memory cell includes a first transistor 300-1 coupled to a first capacitor 710-1, and a second memory cell includes a second transistor 300-2 coupled to a second capacitor 710-2. The capacitors 710 are each coupled to the first contact electrode of the corresponding transistor; e.g., the capacitor 710-1 is coupled to the first contact electrode 310-1 of the first transistor 300-1. The capacitors 710 are further coupled to a PL, as shown in FIG. 2; the PL is omitted from FIG. 7. The second contact electrode of each transistor 300 is coupled to a BL, as shown in FIG. 2; the BL is also omitted from FIG. 7, but example BLs are shown in FIGS. 8 and 9. The BLs connect transistors along the x-direction in the orientation of FIG. 7. In alternate embodiments, the capacitors 710 may be coupled to the second contact electrodes 310-2 and the BLs coupled to the first contact electrodes 310-1.

The gate electrodes 308 extend in the y-direction in the orientation of FIG. 7, forming a WL. For example, the gate electrode 308 of the first transistor 300-1 extends in the y-direction to the gate electrode 308 of the second transistor 300-2. Each WL is also coupled to one or more WL contacts (not shown) to apply signals to the WL.

Example Vertically Stacked and Bonded Memory Arrays

FIG. 8 is a perspective view of an example vertically stacked and bonded memory array, according to some embodiments of the present disclosure. The memory array 800 includes three layers of the memory array 700 shown in FIG. 7, where the memory layers 700 are vertically stacked and bonded together, forming a three-dimensional memory array. Each layer 700 includes a support structure and an array of memory cells. For example, the first layer 700-1 includes a first array of the memory cells shown in FIG. 7 over a first support structure 302-1, the second layer 700-2 includes a second array of the memory cells over a second support structure 302-2, and the third layer 700-3 includes a third array of the memory cells over a third support structure 302-3. The memory array 800 may include more or fewer memory layers, including two memory layers 700, or four or more memory layers 700.

Each memory layer 700 includes a set of BLs 816 coupled to the memory cells, and in particular, coupled to S/D contacts of the transistors. As described with respect to FIG. 2, one of the S/D terminals of each transistor is coupled to a BL 816, and the other one of the S/D terminals of the transistor is coupled to a capacitor. In the orientation shown in FIG. 8, the left S/D contact is coupled to a capacitor, and the right S/D contact is coupled to the BL 816. For example, the right S/D contacts of each of the front-most memory cells (in the y-direction and as depicted in FIG. 8) in the first layer 700-1 are each connected to a first BL 816-1, the right S/D contacts of each of the front-most memory cells in the second layer 700-2 are each connected to a second BL 816-2, and the right S/D contacts of each of the front-most memory cells in the third layer 700-3 are each connected to a third BL 816-3.

While the BLs 816 are depicted as extending below the capacitors and above the left S/D contacts, the BLs 816 may be electrically isolated from the capacitors and left S/D contacts, e.g., using a dielectric material, or by routing the BLs 816 around the capacitors and left S/D contacts. As another example, rather than aligning the transistors so that their sidewalls extend in the x- and y-directions as shown in FIG. 8, the transistors may be fabricated at an angle, so that the left S/D contact is slightly in front of the right S/D contact in the y-direction, or the left S/D contact is slightly behind the right S/D contact in the y-direction. If the transistors are angled, and the BLs 816 extend along the x-direction, the BLs 816 contact the right S/D contacts while skipping the left B/L contacts, which are offset from the BLs 816. As still another example, the transistors may have the same arrangement shown in FIG. 8, and S/D contacts themselves are staggered, so that the left S/D contact is further towards the front in the y-direction and the right S/D contact is further towards the back in the y-direction, or vice versa. If the S/D contacts are offset, and the BLs 816 extend along the x-direction, the BLs 816 contact the right S/D contacts while skipping the left B/L contacts, which are offset from the BLs 816.

In some embodiments, each memory layer 700 is separately fabricated on a respective support structure 302, which may be similar to the support structure 110. For example, the memory layers 700-1, 700-2, and 700-3 may be fabricated on separate wafers, or on different dies of the same wafer. The BLs 816 may be deposited during the fabrication process, e.g., between processing the transistors and the capacitors. Other various features not shown in FIG. 8 may also be processed during this stage, e.g., WLs and PLs, ILD layers, etc. After each memory layer 700 is formed on its respective support structure 302, the support structure is grinded, which significantly thins the support structure 302 and the overall memory layer 700. In some embodiments, the support structure 302 of the lower-most layer (in this case, the support structure 302-1) is not grinded, or is grinded a lesser amount, than the support structures of upper layers (in this case, the support structures 302-2 and 302-3), because the support structure 302-1 of the lower-most memory layer acts as a support structure for the full memory array 800. For example, the support structures 302-1, 302-2, and 302-3 may each have an initial thickness (a dimension measured in the direction of the z-axis of the reference coordinate system) between about 1 micron and 100 microns, which provides a suitably robust structure for processing the memory layers 700-1, 700-2, and 700-3. After the second and third memory layers 700-2 and 700-3 are processed, their front-sides may be attached to a respective carrier structure (e.g., a second support structure), while the support structures 302-2 and 302-3 on the back-sides are grinded to a thickness less than about 5 microns, including any range therein, e.g., between 1 nanometers and 50 nanometers. In some embodiments, the support structures 302-2 and/or 302-3 are completely removed, i.e., to a thickness of 0 nanometers. Thinning the support structures 302 for the upper memory layers enables the memory layers 700 to be vertically stacked and bonded, with vias 804 extending through the support structures to access the memory layers 700. In addition, thinner support structures 302-2 and 302-3 enables a tighter pitch between vias (i.e., a smaller distance between the first via 804-1 and the second via 804-2).

The memory array 800 includes bonding interfaces between the layers 700. For example, a first bonding interface 802-1 couples the support structure 302-2 of the second memory layer 700-2 to the first memory layer 700-1, and a second bonding interface 802-2 couples the support structure 302-3 of the third memory layer 700-3 to the second memory layer 700-2. The bonding interfaces 802 include a bonding material to bond adjacent memory layers 700 together. The bonding interfaces 802 may be similar to the bonding interface 140 described with respect to FIG. 1.

In some alternate embodiments, e.g., embodiments where TFTs are used, the upper memory layers 700-2 and 700-3 may be processed over the first memory layer 700-1, rather than processed separately and bonded. In such embodiments, a support structure 302-2 and 302-3 may be present for the upper layers, e.g., after the first memory layer 700-1 is processed, the support structure 302-2 is deposited over the top of the first memory layer 700-1, and the second memory layer 700-2 is processed over the support structure 302. In such embodiments, the support structures 302 of the upper memory layers (e.g., the support structures 302-2 and 302-3) may have a thickness between about 5 nanometers to 100 nanometers.

Each BL 816 is coupled to a via 804 that extends through the memory layers 700. In the example shown in FIG. 8, the first BL 816-1, second BL 816-2, and third BL 816-3 are each coupled to a first via 804-1. BLs for different columns of memory cells are coupled to different vias; for example, the second columns of memory cells in each of the layers 700-1, 700-2, and 700-3 behind the front-most columns are coupled to a second via 804-2; the third columns of memory cells are coupled to a third via 804-3. The vias 804 extend through the memory layers 700, including their support structures 302, and the bonding interfaces 802. For example, the via 804-1 extends from the memory layer 700-3 through the support structure 302-3, bonding interface 802-2, support structure 302-2, bonding interface 802-1, and to, into, or through the support structure 302-1. The vias 804 may extend through additional layers or materials not shown, e.g., an ILD layer between the support structure 302-1 and bonding interface 802-1, and an ILD layer between the support structure 302-1 and bonding interface 802-2. The vias 804 may extend higher and/or lower than depicted, e.g., partially into the lowermost support structure 302-1, or through the support structure 302-1 and into a layer below (e.g., to the compute logic layer 120).

In some embodiments, portions of the vias 804 extending through each memory layer 700 are processed before the memory layers 700 are stacked. For example, the memory layer 700-1 includes a first portion of the via 804-1, the memory layer 700-2 includes a second portion of the via 804-1, and the memory layer 700-3 includes a third portion of the via 804-1. When the memory layers 700-1, 700-2, and 700-3 are bonded together, the respective portions of the via 804-1 are aligned and connected, forming the via 804-1 extending through the three memory layers 700-1, 700-2, and 700-3. In other embodiments, the vias 804 are formed through the full memory array 800 after the memory layers 700 are fabricated and bonded.

FIG. 9 is a perspective view of an example vertically stacked and bonded memory array with a different via configuration, according to some embodiments of the present disclosure. The memory array 900 includes three layers of the memory array 700 shown in FIG. 7, where the memory layers 700 are vertically stacked and bonded together, forming a three-dimensional memory array. As in FIG. 8, each layer 700 includes a support structure and an array of memory cells, and the arrangement of the memory layers 700 in FIG. 9 is similar to the arrangement of the memory layers 700 described above with respect to FIG. 8. For example, the layer 700-1 includes a first array of the memory cells shown in FIG. 7 over a first support structure 302-1, the layer 700-2 includes a second array of the memory cells over a second support structure 302-2, and the layer 700-3 includes a third array of the memory cells over a third support structure 302-3. Each memory layer 700 includes a set of BLs 916, e.g., memory layer 700-1 includes BL 916-1, memory layer 700-2 includes BL 916-2, and memory layer 700-3 includes BL 916-3, which are similar to the BLs 816 in FIG. 8. The memory layers 700 are bonded together at bonding interfaces 902-1 and 902-2, which are similar to the bonding interfaces 802 described with respect to FIG. 8.

In the arrangement of FIG. 8, each via 804 was coupled to a BL on each of the memory layers 700, e.g., via 804-1 was coupled to BLs 816-1, 816-2, and 816-3. In the arrangement shown in FIG. 9, each respective memory layer 700 is coupled to a different set of vias 904. For example, the first memory layer 700-1 has three BLs, each coupled to one of a first set of vias 908 (e.g., BL 916-1 is coupled to the via 908-1); the second memory layer 700-2 has three BLs, each coupled to one of a second set of vias 906 (e.g., BL 916-2 is coupled to the via 906-1); and the third memory layer 700-3 has three BLs, each coupled to one of a third set of vias 904 (e.g., BL 916-3 is coupled to the via 904-1). In this example, the portions of the support structures 302 and bonding interfaces 902 are cut away in the region of the vias 904, 906, and 908 to better show the arrangement of the vias, but the support structures 302 and bonding interfaces 902 may extend through the region of the vias, as shown in FIG. 8.

Figure 12:
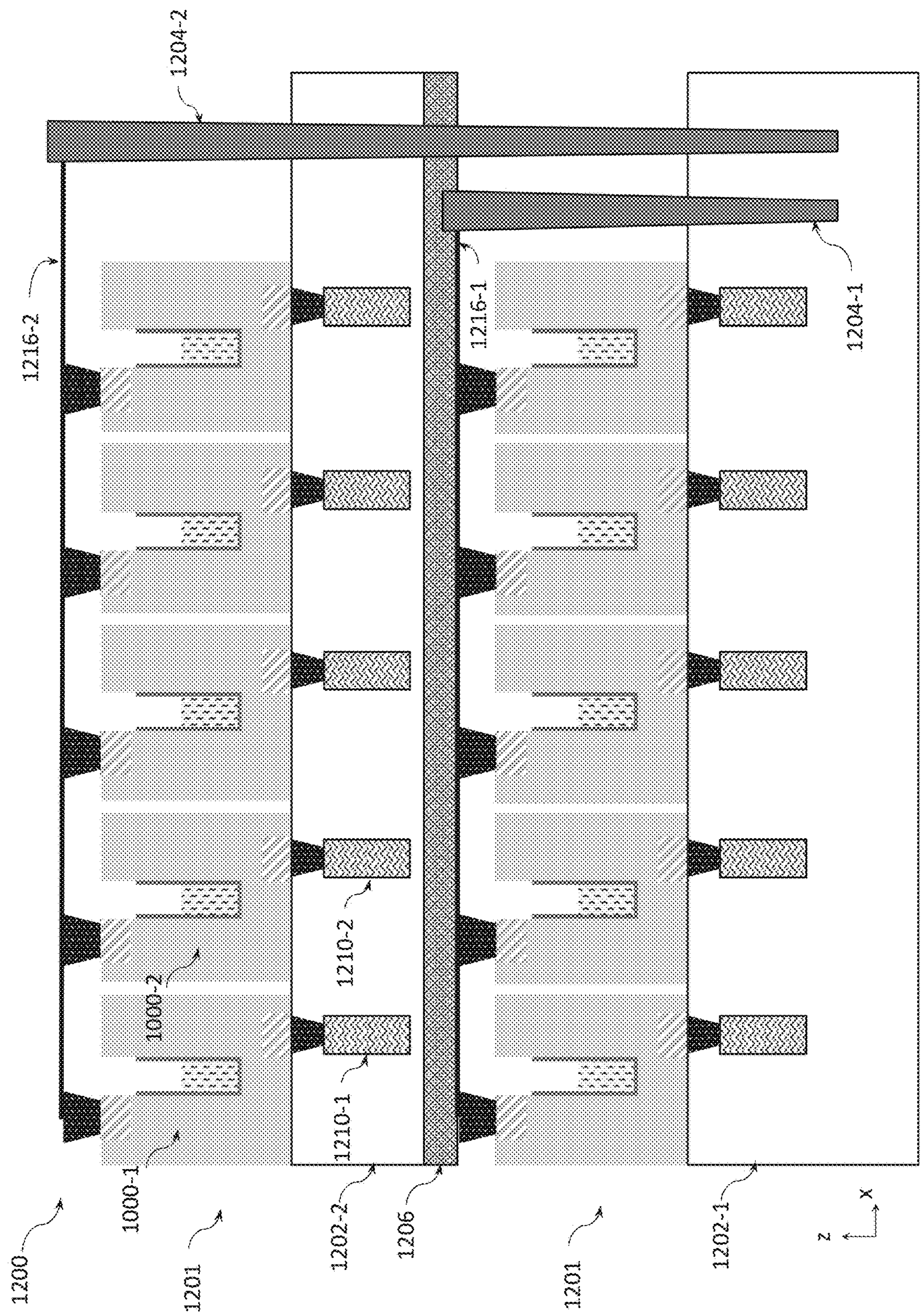
FIG. 12 is a cross-sectional view of an example vertically stacked and bonded memory array with back-side contact transistors and a second via arrangement, according to some embodiments of the present disclosure.

Some BLs 916 are depicted as extending near or through certain vias to which they are not coupled, e.g., the BL 916-1, coupled to the via 908-1, is depicted as extending through the vias 904-1 and 906-1, and the BL 916-2, coupled to the via 906-1 is depicted as extending through the via 904-1. The BLs 916 may be electrically isolated from the vias to which they are not coupled, e.g., by using a dielectric material, or by routing the BLs 916 around the vias to which they are not coupled. In other embodiments, the vias 904-908 may be arranged differently than shown in FIG. 9; for example, the vias 908 coupled to the lowest memory layer 700-1 may be positioned nearest to the memory cells, and the vias 904 coupled to the highest memory layer 700-3 may be positioned farthest from the memory cells; such an example is shown in FIG. 12.

While the memory arrays 800 and 900 are illustrated as comprising three-dimensional transistors with a recessed gate, embodiments of the present disclosure are not limited to only this design and include memory arrays comprising transistors of various other architectures, or a mixture of different architectures. For example, bottom-gated transistors, top-gated transistors, FinFETs, nanowire transistors, and planar transistors, and memory arrays containing such transistor architectures, are within the scope of the present disclosure.

While the memory arrays 800 and 900 show the BL arrangements and vias coupled to the BLs, each memory cell may be similarly coupled to vias for controlling its GL and/or PL. For example, the GLs of rows of memory cells may extend in the y-direction in the orientation of FIGS. 8 and 9, and the GLs may be connected to a set of vias similar to the vias 804 or the vias 904-908.

Example Three-Dimensional Transistor with Recessed Gate and Back-Side Contact

Figure 10:
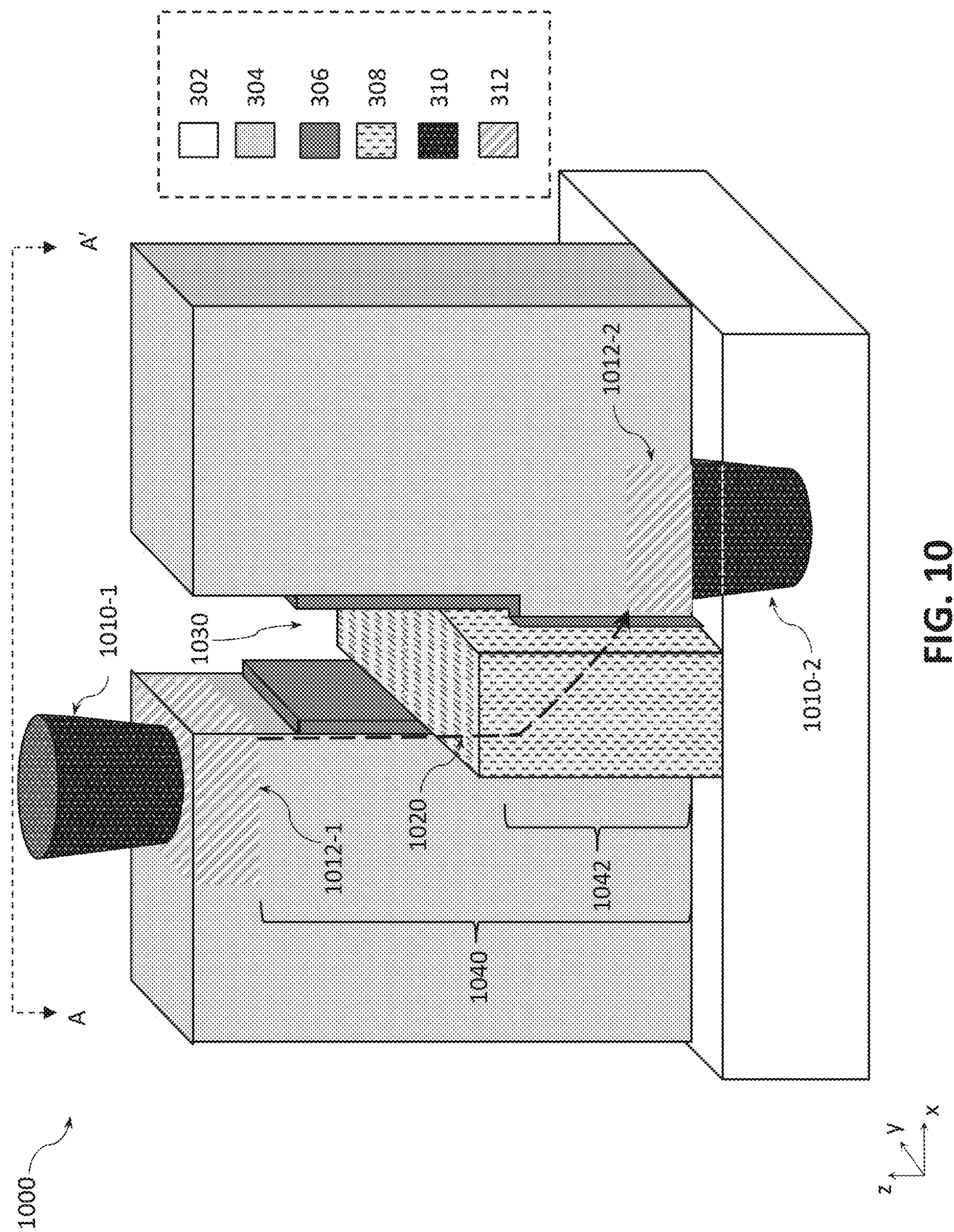
FIG. 10 is a perspective view of an example three-dimensional transistor with a recessed gate and a back-side contact, according to some embodiments of the present disclosure.

FIG. 10 is a perspective view of an example three-dimensional transistor with a recessed gate and a back-side contact, according to some embodiments of the present disclosure. The legend illustrates that FIG. 10 uses different patterns to show the same set of materials shown in FIGS. 3-6, i.e., the support structure 302, the channel material 304, the gate dielectric 306, the gate electrode 308, the contact electrodes 310, and the S/D regions 312.

The transistor 1000 includes two S/D regions 1012-1 and 1012-2 formed from the S/D material 312 coupled to two contact electrodes 1010-1 and 1010-2 formed from the contact electrode material 310. The first contact electrode 1010-1 is a front-side contact, similar to the contact electrode 310-1 shown in FIG. 3. The second contact electrode 1010-2 is a back-side contact, coupled to an S/D region 1012-2 formed on the back-side of the channel material 304, i.e., the side closer to the support structure 302. The first S/D region 1012-1 is in a first layer over the support structure 302, i.e., the same layer 410 shown in FIG. 4. The portion of the gate stack (i.e., the gate dielectric 306 and gate electrode 308) over the portion of the channel material 304 under the recess is in a second layer over the support structure 302, i.e., the same layer 412 shown in FIG. 4. Unlike the example shown in FIG. 4, the second S/D region 1012-2 is not in the first layer 410, but rather in a third layer over the support structure 302 that is between the second layer and the support structure 302, and the second layer having the gate stack is between the first layer (the layer of the first S/D region 1012-1) and the third layer (the layer of the second S/D region 1012-2).

FIG. 10 illustrates two distances 1040 and 1042, where the first distance 1040 is a distance from the S/D region 1012-1 and the support structure 302, and the second distance 1042 is a distance from the portion of the gate stack situated over the channel material 304 to the support structure 302. The first distance 1040 is similar to the distance 340, and the first distance 1040 may be within the ranges described with respect to the distance 340. The second distance 1042 is similar to the distance 342, and the second distance 1042 may be within the ranges described with respect to the distance 342. As describe with respect to FIG. 3, the second distance 1042 is smaller than the first distance 1040, i.e., the distance from the support structure 302 to the portion of the gate stack over the channel material is smaller than the distance from the support structure 302 to the first S/D region 1012-1.

FIG. 10 also illustrates an example path 1020 between the S/D regions 1012-1 and 1012-2. The path 1020 is an example current pathway between the S/D regions. The path 1020 represents a shortest path between the two S/D regions 1012, extending from the first S/D region 1012-1 down a sidewall of the recess (similar to the first sidewall 402-1), and diagonally from the lower-left corner of the recess to the second S/D region 1012-2. The direction of current may be the opposite of the direction shown in FIG. 10, i.e., current may alternatively travel from the second S/D region 1012-2 to the first S/D region 1012-1. As illustrated in FIG. 10, the shortest path 1020 is not a straight line. Instead, the shortest path 1020 travels in down the sidewall and then bends under the recess. This is in contrast to the shortest path of a conventional FinFET, which is a straight line directly under the gate oxide. A back-side contact FinFET, in which the gate is not recessed (as it is in FIG. 10), typically has a shortest path between the S/D regions that is a straight, diagonal line through the channel material.

Example Vertically Stacked and Bonded Memory Arrays with Back-Side Contact Transistors Transistors with one front-side and one back-side contact, such as the transistor 1000 shown in FIG. 10, can be used to create arrays of 1T-1C memory cells with capacitors coupled to the back-side contacts. In such examples, the capacitors may be in a FEOL layer, and the transistors in a BEOL layer. These memory arrays can be vertically stacked and bonded in a manner similar to the vertically stacked and bonded memory arrays shown in FIGS. 8 and 9.

Figure 11:
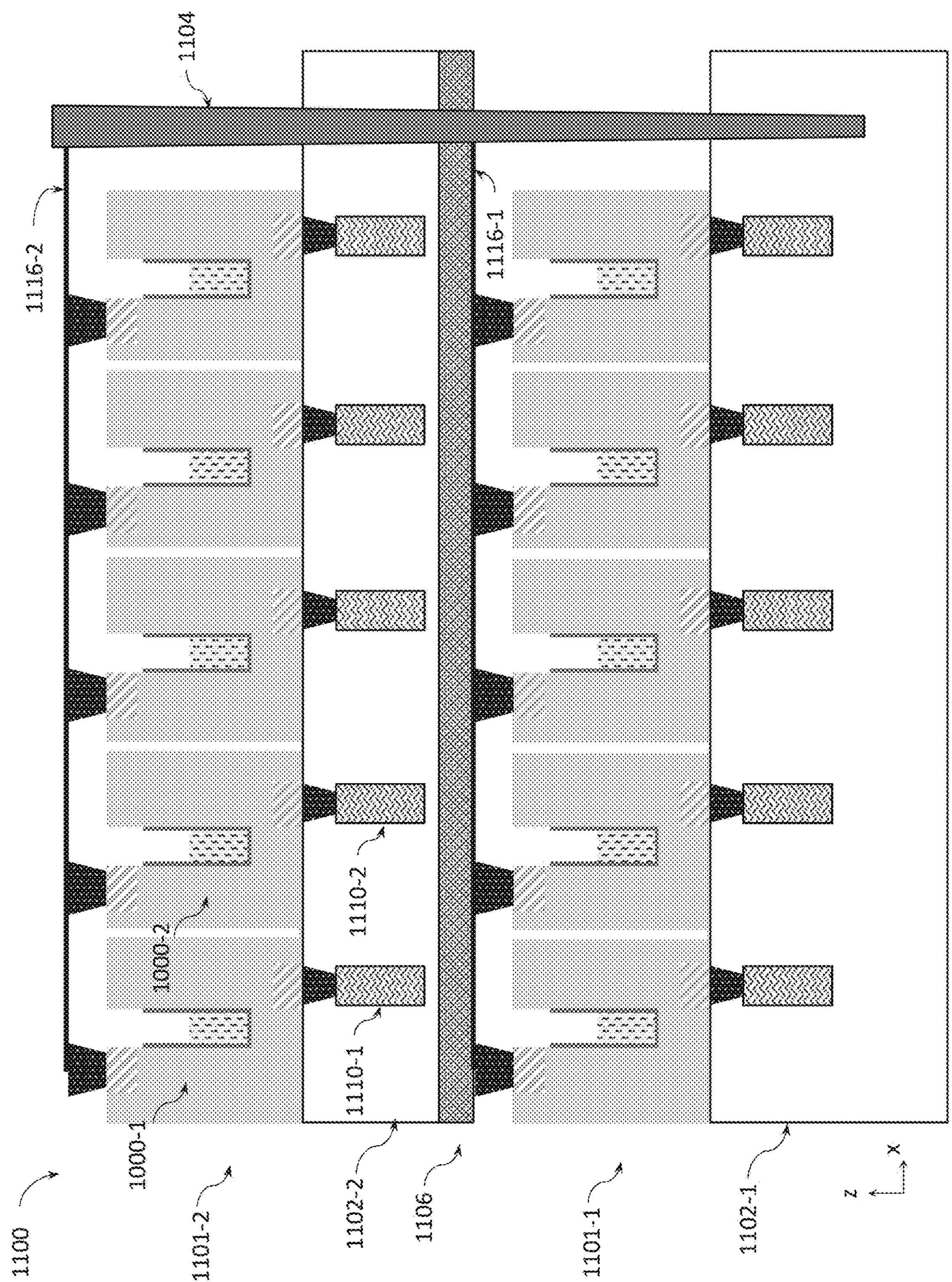
FIG. 11 is a cross-sectional view of an example vertically stacked and bonded memory array with back-side contact transistors and a first via arrangement, according to some embodiments of the present disclosure.

FIG. 11 is a cross-sectional view of an example vertically stacked and bonded memory array with back-side contact transistors and a first via arrangement, according to some embodiments of the present disclosure. The cross-sectional view is in the x-z plane of the example coordinate system x-y-z shown in FIG. 10, with the cross section of each of the transistors 1000 taken across the fin of channel material 304 in FIG. 10, e.g., along the plane shown in FIG. 10 as a plane AA'. The array 1100 includes two layers 1101 of the memory cells, where each memory cell includes a transistor 1000 coupled to a capacitor 1110. The capacitors 1110 in each layer extend into a support structure 1102, which is similar to the support structure 302. The layers 1101 are bonded at a bonding interface 1106. The cross section shown in FIG. 11 shows cross-sections of two columns of a respective layer 1101-1 and 1101-2 memory cells, each column having five memory cells. In other embodiments, the columns may, and typically would, include many more memory cells. In addition, each layer 1101 of the memory array 1100 may include additional columns of memory cells in front of and/or behind the column shown in FIG. 11 in the y-direction, so that each memory layer 1101 extends in both the x- and y-directions, e.g., as shown in FIGS. 8 and 9. Furthermore, while two example layers 1101 are shown in FIG. 11, the memory array 1100 may include more memory layers than shown in FIG. 11, e.g., three, four, or more memory layers.

Each of the memory cells in the memory array 1100 includes the transistor 1000 shown in FIG. 10, and a capacitor 1110. For example, a first memory cell includes a first transistor 1000-1 coupled to a first capacitor 1110-1, and a second memory cell includes a second transistor 1000-2 coupled to a second capacitor 1110-2. The capacitors 1110 are each coupled to the back-side contact electrode of the corresponding transistor, i.e., the contact electrode 1010-2 shown in FIG. 10. The capacitors 1110 extend into support structures 1102, e.g., the first capacitor 1110-1 extends into the second support structure 1102-2. In other embodiments, the back-side contact electrode may extend through the support structure 1102, with the capacitors 1110 formed in a layer below the support structure 1102.

Each memory layer 1101 includes a set of BLs 1116, e.g., memory layer 1101-1 includes BL 1116-1, and memory layer 1101-2 includes BL 1116-2. The BLs 1116 are coupled to the front-side contacts of the transistors 1000. The memory layers 1101-1 and 1101-2 are bonded together at a bonding interface 1106, which is similar to the bonding interfaces 802 described with respect to FIG. 8. A single via 1104 is coupled to the BLs 1116-1 and 1116-2. Additional columns of the memory layers 1101-1 and 1101-2 at other locations in the y-direction (e.g., in front of or behind the cross section shown in FIG. 11) may be coupled to different BLs, which are coupled to different vias, as illustrated in FIG. 8.

As described with respect to FIG. 8, after the individual memory layers 1101 are fabricated, support structures 1102, and in particular, support structure of the higher memory layers (e.g., support structure 1102-2 in this example) may be grinded before the layers 1101 are bonded together to form the memory array 1100. For example, the support structure 1102-2 may have an initial thickness between about 1 micron and 100 microns, which provides a suitably robust structure 1102-2 for processing the memory layer 1101-2. After the memory layer 1101-2 is processed, the support structure 1102-2 is grinded to reduce thickness height to between, for example, 200 nanometers and 5 microns, or any range therein, e.g., between 200 nanometers and 2 microns. The thickness of the grinded support structure 1102-2 may be determined based on the depth that the capacitors 1110 extending into the support structure 1102-2. The vias 1104 may be formed in a similar manner to the vias 804 described with respect to FIG. 8.

FIG. 12 is a cross-sectional view of an example vertically stacked and bonded memory array with back-side contact transistors and a second via arrangement, according to some embodiments of the present disclosure. The cross-sectional view is in the x-z plane of the example coordinate system x-y-z shown in FIG. 10, with the cross section of each of the transistors 1000 taken across the fin of channel material 304 in FIG. 10, e.g., along the plane shown in FIG. 10 as a plane AA'. The array 1200 includes two layers 1201-1 and 1201-2, which are similar to the layers 1101-1 and 1101-2 shown in FIG. 11. For example, each layer 1201 includes transistors coupled to capacitors to form 1C-1T memory cells; e.g., a first memory cell includes a first transistor 1000-1 coupled to a first capacitor 1210-1, and a second memory cell includes a second transistor 1000-2 coupled to a second capacitor 1210-2. The capacitors 1210 are each coupled to the back-side contact electrode of the corresponding transistor, and the capacitors 1210 extend into support structures 1202.

Each memory layer 1201 includes a set of BLs 1216, e.g., memory layer 1201-1 includes BL 1216-1, and memory layer 1201-2 includes BL 1216-2. The BLs 1216 are coupled to the front-side contacts of the transistors 1000. The memory layers 1201-1 and 1201-2 are bonded together at a bonding interface 1206, which is similar to the bonding interfaces 802 described with respect to FIG. 8. In this example, a first via 1204-1 is coupled to the BL 1216-1 of the first memory layer 1201-1, and a second via 1204-2 is coupled to the BL 1216-2 of the second memory layer 1201-2. Additional columns of the memory layers 1201-1 and 1201-2 at other locations in the y-direction (e.g., in front of or behind the cross section shown in FIG. 12) may be coupled to different BLs, which are coupled to different vias, as illustrated in FIG. 9.

More generally, in the arrangement shown in FIG. 12, each respective memory layer 1201 is coupled to a different set of vias. For example, the first memory layer 1201-1 has a first set of BLs 1216, each BL coupled to a column of memory cells, and each BL coupled to a respective via of a first set of vias. Similarly, the second memory layer 1201-2 has a second set of BLs 1216, each BL coupled to a respective via of a second set of vias, which are different from the first set of vias. In this way, each layer of the memory array 1200 can be separately addressed. In this example, the via 1204-1 coupled to the lower memory layer 1201-1 is positioned nearer to the memory cells than the via 1204-2 coupled to the upper memory layer 1202-2. Other via arrangements may be used, such as the arrangements shown in and described with respect to FIG. 9.

While the memory arrays 1100 and 1200 are illustrated as comprising three-dimensional transistors with a recessed gate, embodiments of the present disclosure are not limited to only this design and include memory arrays comprising transistors of various other architectures, or a mixture of different architectures. For example, bottom-gated transistors, top-gated transistors, back-gated transistors, front-gated transistors, FinFETs, nanowire transistors, and planar transistors, and memory arrays containing such transistor architectures, are within the scope of the present disclosure.

While the memory arrays 1100 and 1200 show the BL arrangements and vias coupled to the BLs, each memory cell may be similarly coupled to vias for controlling its GL and/or PL. For example, the GLs of rows of memory cells may extend in the y-direction in the orientation of FIGS. 11 and 12, and the GLs may be connected to a set of vias similar to the via 1104 or the vias 1204.

Example Devices

The vertically stacked and bonded memory array disclosed herein may be included in any suitable electronic device. FIGS. 13-16 illustrate various examples of apparatuses that may include one or more of the vertically stacked and bonded memory arrays disclosed herein.

Figure 13B:
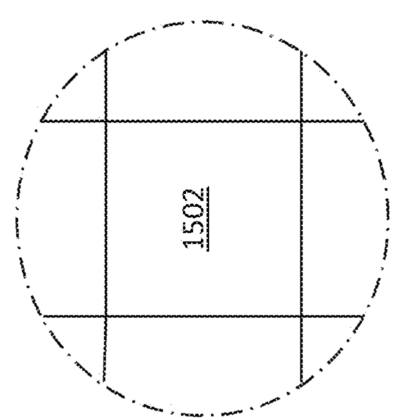
FIGS. 13A and 13B are top views of a wafer and dies that include one or more vertically stacked and bonded memory arrays in accordance with any of the embodiments disclosed herein.
Figure 13A:
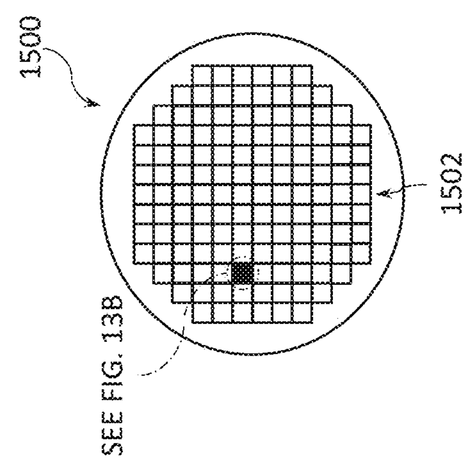

FIGS. 13A and 13B are top views of a wafer and dies that include one or more IC structures with one or more vertically stacked and bonded memory arrays in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIGS. 1-12, or any further embodiments of the IC structures described herein). After the fabrication of the semiconductor product is complete (e.g., after manufacture of one or more IC structures with one or more vertically stacked and bonded memory arrays as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more IC structures with one or more vertically stacked and bonded memory arrays as disclosed herein may take the form of the wafer 1500 (e.g., not singulated) or the form of the die 1502 (e.g., singulated). The die 1502 may include one or more transistors (e.g., one or more of the transistors 1640 of FIG. 14, discussed below) and/or supporting circuitry to route electrical signals to the transistors, as well as any other IC components (e.g., one or more IC structures with one or more vertically stacked and bonded memory arrays). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 16) or other logic that is configured to store information in the memory devices or execute instructions stored in the memory array.

Figure 14:
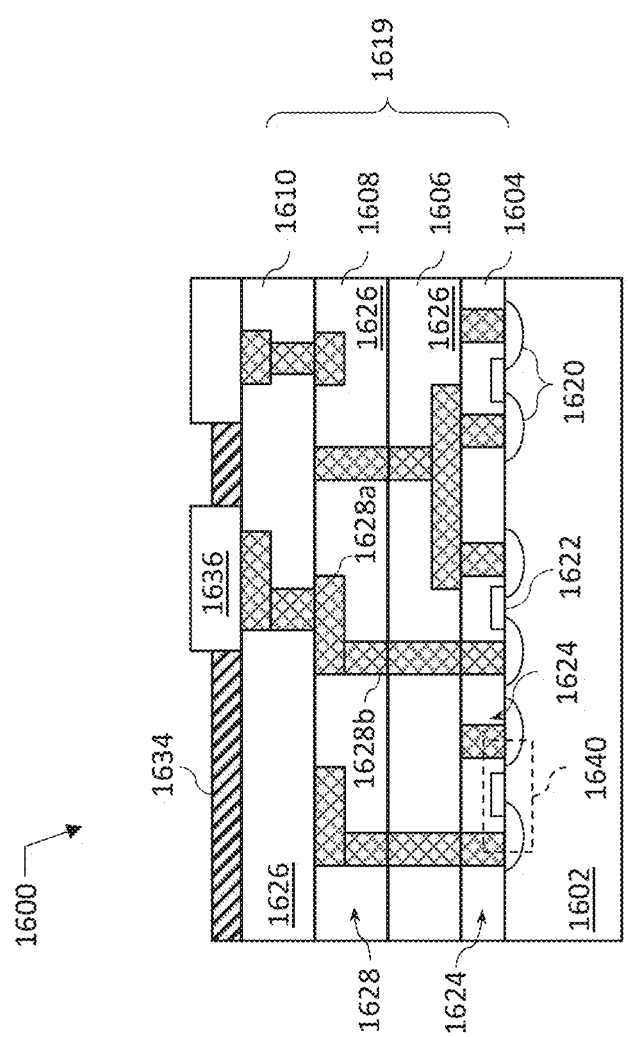
FIG. 14 is a cross-sectional side view of an IC device that may include one or more vertically stacked and bonded memory arrays in accordance with any of the embodiments disclosed herein.

FIG. 14 is a cross-sectional side view of an IC device 1600 that may include one or more IC structures with one or more vertically stacked and bonded memory arrays in accordance with any of the embodiments disclosed herein. The IC device 1600 may be formed on a substrate 1602 (e.g., the wafer 1500 of FIG. 13A) and may be included in a die (e.g., the die 1502 of FIG. 13B). The substrate 1602 may be any substrate as described herein. The substrate 1602 may be part of a singulated die (e.g., the dies 1502 of FIG. 13B) or a wafer (e.g., the wafer 1500 of FIG. 13A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more S/D regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 14 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Although not specifically shown in FIG. 14, the IC device 1600 may include one or more vertically stacked and bonded memory arrays at any suitable location in the IC device 1600.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 14 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 14). Although a particular number of interconnect layers 1606-1610 is depicted in FIG. 14, embodiments of the present disclosure include IC devices having more or fewer interconnect layers than depicted.

In some embodiments, the interconnect structures 1628 may include trench contact structures 1628*a* (sometimes referred to as "lines") and/or via structures 1628*b* (sometimes referred to as "holes") filled with an electrically conductive material such as a metal. The trench contact structures 1628*a* may be arranged to route electrical signals in a direction of a plane that is substantially parallel with a surface of the substrate 1602 upon which the device layer 1604 is formed. For example, the trench contact structures 1628*a* may route electrical signals in a direction in and out of the page from the perspective of FIG. 14. The via structures 1628*b* may be arranged to route electrical signals in a direction of a plane that is substantially perpendicular to the surface of the substrate 1602 upon which the device layer 1604 is formed. In some embodiments, the via structures 1628*b* may electrically couple trench contact structures 1628*a* of different interconnect layers 1606-1610 together.

The interconnect layers 1606-1610 may include a dielectric material 1626 disposed between the interconnect structures 1628, as shown in FIG. 14. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628*a* and/or via structures 1628*b*, as shown. The trench contact structures 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628*b* to couple the trench contact structures 1628*a* of the second interconnect layer 1608 with the trench contact structures 1628*a* of the first interconnect layer 1606. Although the trench contact structures 1628*a* and the via structures 1628*b* are structurally delineated with a line within each interconnect layer (e.g., within the second interconnect layer 1608) for the sake of clarity, the trench contact structures 1628*a* and the via structures 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 15:
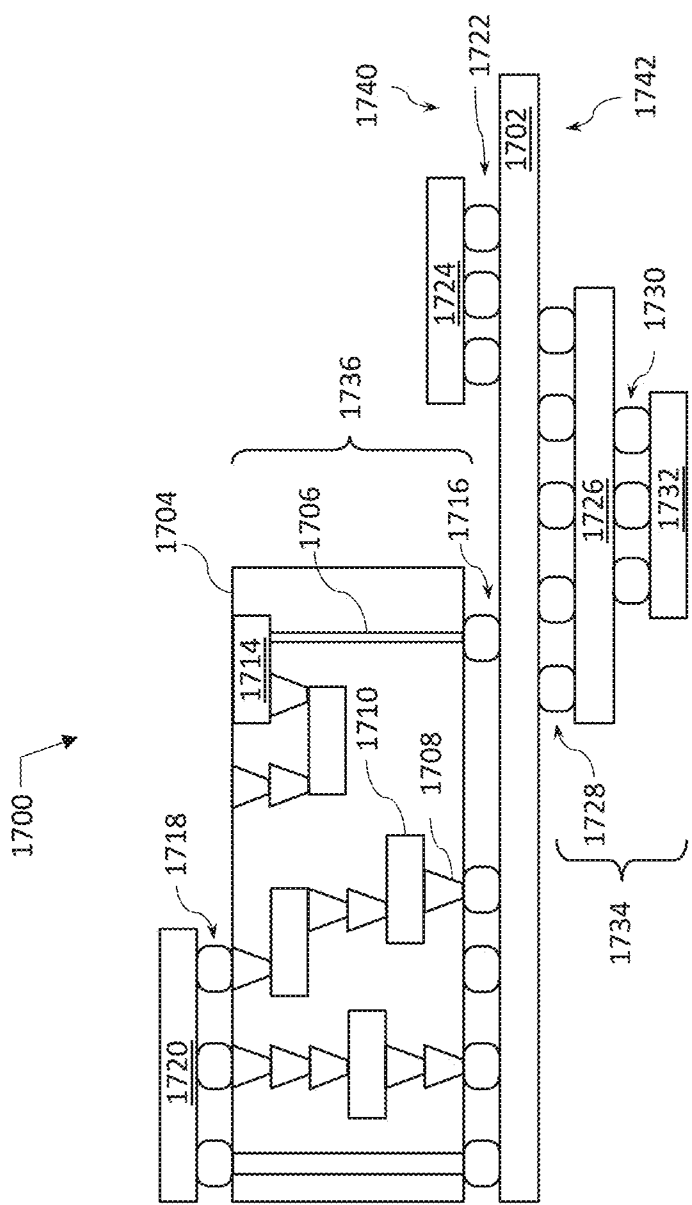
FIG. 15 is a cross-sectional side view of an IC device assembly that may include one or more vertically stacked and bonded memory arrays in accordance with any of the embodiments disclosed herein.

FIG. 15 is a cross-sectional side view of an IC device assembly 1700 that may include components having or being associated with (e.g., being electrically connected by means of) one or more IC structures with vertically stacked and bonded memory arrays in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the vertically stacked and bonded memory arrays, disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 15 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 15), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 15, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 13B), an IC device (e.g., the IC device 1600 of FIG. 14), or any other suitable component. In some embodiments, the IC package 1720 may include one or more vertically stacked and bonded memory arrays, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 15, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The interposer 1704 may further include one or more vertically stacked and bonded memory arrays, as described herein. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 15 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 16:
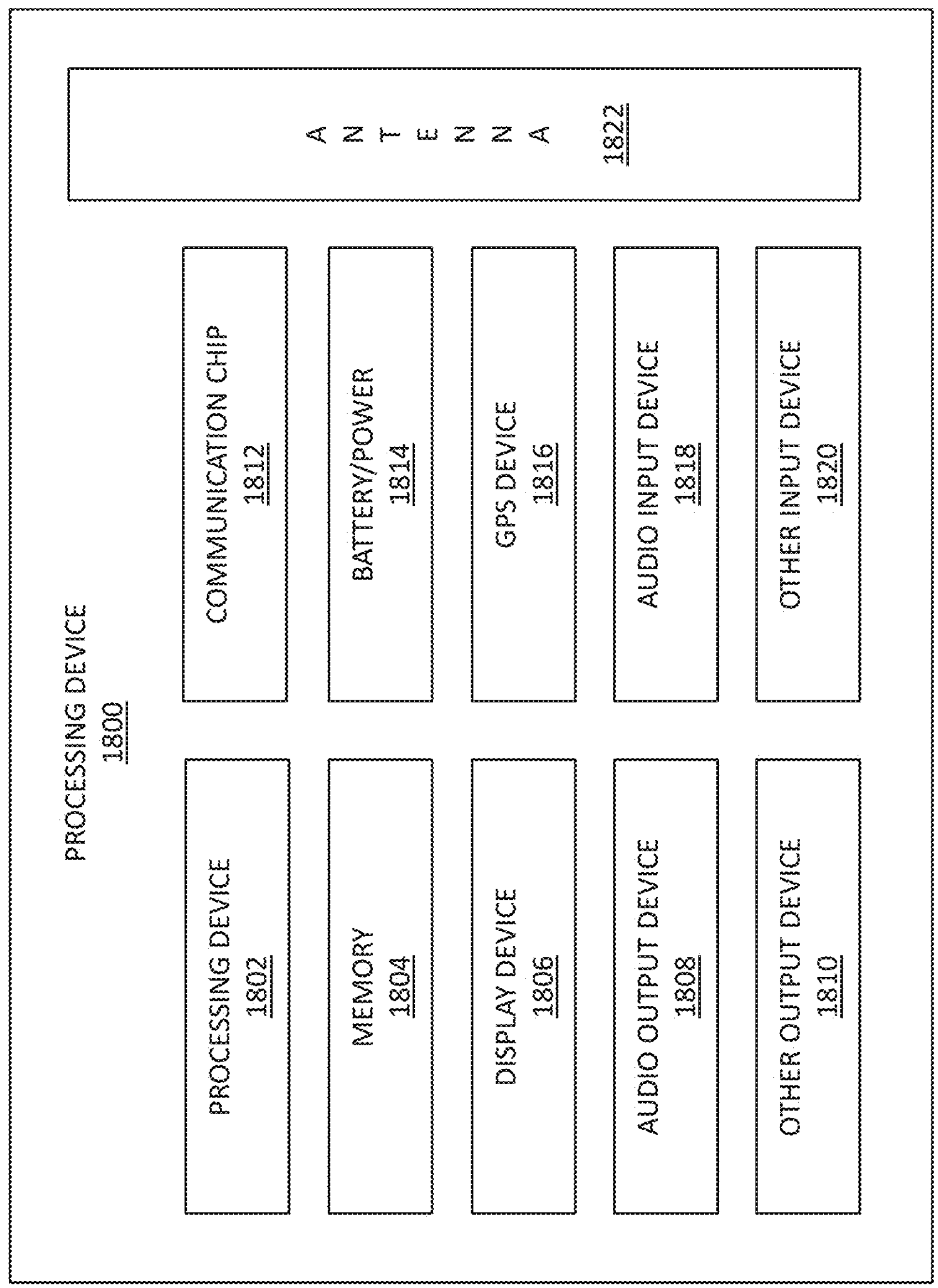
FIG. 16 is a block diagram of an example computing device that may include one or more vertically stacked and bonded memory arrays in accordance with any of the embodiments disclosed herein.

FIG. 16 is a block diagram of an example computing device 1800 that may include one or more components including one or more IC structures with one or more vertically stacked and bonded memory arrays in accordance with any of the embodiments disclosed herein. For example, any suitable ones of the components of the computing device 1800 may include a die (e.g., the die 1502 of FIG. 13B) having one or more vertically stacked and bonded memory arrays as described herein. Any one or more of the components of the computing device 1800 may include, or be included in, an IC device 1600 (FIG. 14). Any one or more of the components of the computing device 1800 may include, or be included in, an IC device assembly 1700 (FIG. 15).

A number of components are illustrated in FIG. 16 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 16, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include eDRAM or spin-transfer torque magnetic random-access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides an IC device that includes a first memory layer including a first support structure and a first plurality of memory cells; a second memory layer including a second support structure and a second plurality of memory cells; a first bonding interface coupling the support structure of the second memory layer to the first memory layer, the first bonding interface including a first bonding material to bond the second memory layer to the first memory layer; a first bit-line coupled to a portion of the first plurality of memory cells; a second bit-line coupled to a portion of the second plurality of memory cells; and a via coupled to the second bit-line, where the via extends through the second support structure and the first bonding interface.

Example 2 provides the IC device according to example 1, where the second support structure has a thickness of less than 5 microns, including all values and ranges therein, e.g., between about 1 nanometer and 50 nanometers, or between 200 nanometers and 2 microns if capacitors are formed in the second support structure.

Example 3 provides the IC device according to example 1 or 2, where the via is further coupled to the first bit-line.

Example 4 provides the IC device according to example 1 or 2, further including a second via coupled to the first bit-line.

Example 5 provides the IC device according to example 4, where the second via is nearer to the first memory layer than the first via.

Example 6 provides the IC device according to any of the preceding examples, where the via further extends at least partially through the first support structure.

Example 7 provides the IC device according to any one of the preceding examples, where the bonding material includes at least one of oxygen, nitrogen, carbon, and silicon.

Example 8 provides the IC device according to any one the preceding examples, where a first of the first plurality of memory cells includes a transistor and a capacitor coupled to a portion of the transistor.

Example 9 provides the IC device according to example 8, where the transistor has a recessed gate.

Example 10 provides the IC device according to example 8 or 9, where the transistor includes a first source or drain (S/D) region, a second S/D region, and a channel material between the first S/D region and the second S/D region; the capacitor is coupled to the first S/D region via a first S/D contact; the transistor further includes a second S/D contact coupled to the second S/D region; and the first S/D contact and the second S/D contact are in a same layer.

Example 11 provides the IC device according to example 8 or 9, where the transistor includes a first source or drain (S/D) region, a second S/D region, and a channel material between the first S/D region and the second S/D region; the first bit-line is coupled to the first S/D region via a first S/D contact; the capacitor is coupled to the second S/D region via a first S/D contact; and the channel material is in a layer that is between the first S/D contact and the capacitor.

Example 12 provides an IC device that includes a first memory layer including a first support structure and a first plurality of memory cells, a second memory layer including a second support structure and a second plurality of memory cells, and a first bonding interface coupling the support structure of the second memory layer to the first memory layer, the first bonding interface including a first bonding material to bond the second memory layer to the first memory layer. One of the memory cells in the first memory layer includes a channel material having a longitudinal structure extending in a direction parallel to an upper face of the first support structure; a first source or drain (S/D) region at a first distance from the support structure; a second S/D region; and a gate stack having a portion over a portion of the channel material so that the portion of the channel material is between the portion of the gate stack and the support structure, where the portion of the gate stack over the portion of the channel material is at a second distance from the support structure, the second distance being smaller than the first distance.

Example 13 provides the IC device according to example 12, where the channel material has a recess, and the portion of the gate stack extending over the portion of the channel material is in the recess.

Example 14 provides the IC device according to example 13, where the recess includes two sidewalls and a base, and the gate stack includes a gate dielectric material along the base and at least a portion of each of the two sidewalls; and a gate electrode material within the recess, where the gate dielectric material is between the gate electrode material and the channel material.

Example 15 provides the IC device according to any of examples 12-14, the one of the memory cells further including a capacitor coupled to the second S/D region, the capacitor and the first transistor forming a memory cell.

Example 16 provides the IC device according to example 15, where an S/D contact is coupled to the first S/D region, and the channel material is in a layer that is between the first S/D contact and the capacitor.

Example 17 provides the IC device according to example 15, where first S/D region and the second S/D region are in a same layer.

Example 18 provides the IC device according to example 12, further including: a first bit-line coupled to a portion of the first plurality of memory cells; a second bit-line coupled to a portion of the second plurality of memory cells; and a via coupled to the second bit-line, where the via extends through the second support structure and the first bonding interface.

Example 19 provides a method for fabricating an IC device that includes the steps of forming a first memory layer having a first support structure and a first plurality of memory cells; forming a second memory layer having a second support structure and a second plurality of memory cells; thinning the second support structure; bonding the support structure of the second memory layer to the first memory layer using a bonding material; and forming a via coupled to at least a portion of the second plurality of memory cells, where the via extends through the second support structure and the first bonding interface.

Example 20 provides the method according to example 19, where the second support structure is thinned to have a thickness of less than 5 microns, including all values and ranges therein, e.g., between about 1 nanometer and 50 nanometers, or between 200 nanometers and 2 microns if capacitors are formed in the second support structure.

Example 21 provides an IC package that includes an IC die, including one or more of the memory/IC devices according to any one of the preceding examples. The IC package may also include a further component, coupled to the IC die.

Example 22 provides the IC package according to example 21, where the further component is one of a package substrate, a flexible substrate, or an interposer.

Example 23 provides the IC package according to examples 21 or 22, where the further component is coupled to the IC die via one or more first level interconnects.

Example 24 provides the IC package according to example 23, where the one or more first level interconnects include one or more solder bumps, solder posts, or bond wires.

Example 25 provides a computing device that includes a circuit board; and an IC die coupled to the circuit board, where the IC die includes one or more of the memory/IC devices according to any one of the preceding examples (e.g., memory/IC devices according to any one of examples 1-20), and/or the IC die is included in the IC package according to any one of the preceding examples (e.g., the IC package according to any one of examples 21-24).

Example 26 provides the computing device according to example 25, where the computing device is a wearable computing device (e.g., a smart watch) or hand-held computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:

a first memory layer comprising a first support structure and a first plurality of memory cells;

a second memory layer comprising a second support structure and a second plurality of memory cells;

a first bonding interface coupling the second support structure of the second memory layer to the first memory layer, the first bonding interface comprising a bonding material to bond the second memory layer to the first memory layer;

a first bit-line coupled to a portion of the first plurality of memory cells;

a second bit-line coupled to a portion of the second plurality of memory cells; and a via coupled to the second bit-line, wherein the via extends through the second support structure and the first bonding interface.

2. The IC device according to claim 1, wherein the second support structure has a thickness of less than 5 microns.

3. The IC device according to claim 1, wherein the via is further coupled to the first bit-line.

4. The IC device according to claim 1, wherein the via is a first via, the IC device further comprising a second via coupled to the first bit-line.

5. The IC device according to claim 4, wherein the second via is nearer to the first memory layer than the first via.

6. The IC device according to claim 1, wherein the via further extends at least partially through the first support structure.

7. The IC device according to claim 1, wherein the bonding material comprises at least one of oxygen, nitrogen, carbon, and silicon.

8. The IC device according to claim 1, wherein a first of the first plurality of memory cells comprises a transistor and a capacitor coupled to a portion of the transistor.

9. The IC device according to claim 8, wherein the transistor comprises a recessed gate.

10. The IC device according to claim 8, wherein:

the transistor comprises a first source or drain (S/D) region, a second S/D region, and a channel material between the first S/D region and the second S/D region;

the capacitor is coupled to the first S/D region via a first S/D contact;

the transistor further comprises a second S/D contact coupled to the second S/D region; and the first S/D contact and the second S/D contact are in a same layer.

11. The IC device according to claim 8, wherein:

the transistor comprises a first source or drain (S/D) region, a second S/D region, and a channel material between the first S/D region and the second S/D region;

the first bit-line is coupled to the first S/D region via a first S/D contact;

the capacitor is coupled to the second S/D region via a first S/D contact; and the channel material is in a layer that is between the first S/D contact and the capacitor.

12. An integrated circuit (IC) device, comprising:

a first memory layer comprising a first support structure and a first plurality of memory cells, one of the memory cells comprising:

a channel material having a longitudinal structure extending in a direction parallel to the first support structure;

a first source or drain (S/D) region at a first distance from the first support structure;

a second S/D region; and a gate stack having a portion over a portion of the channel material, where the portion of the gate stack over the portion of the channel material is at a second distance from the first support structure, the second distance being smaller than the first distance;

a second memory layer comprising a second support structure and a second plurality of memory cells; and a first bonding interface coupling the second support structure of the second memory layer to the first memory layer, the first bonding interface comprising a first bonding material to bond the second memory layer to the first memory layer.

13. The IC device according to claim 12, wherein the channel material has a recess, and the portion of the gate stack extending over the portion of the channel material is in the recess.

14. The IC device according to claim 13, wherein the recess comprises two sidewalls and a base, and the gate stack comprises:

a gate dielectric material along the base and at least a portion of each of the two sidewalls; and a gate electrode material within the recess, where the gate dielectric material is between the gate electrode material and the channel material.

15. The IC device according to claim 12, the one of the memory cells further comprising a capacitor coupled to the second S/D region.

16. The IC device according to claim 15, wherein an S/D contact is coupled to the first S/D region, and the channel material is in a layer that is between the first S/D contact and the capacitor.

17. The IC device according to claim 15, wherein first S/D region and the second S/D region are in a same layer.

18. The IC device according to claim 12, further comprising:

a first bit-line coupled to a portion of the first plurality of memory cells;

a second bit-line coupled to a portion of the second plurality of memory cells; and a via coupled to the second bit-line, wherein the via extends through the second support structure and the first bonding interface.

19. A method for fabricating an integrated circuit (IC) device, comprising:

forming a first memory layer comprising a first support structure and a first plurality of memory cells;

forming a second memory layer comprising a second support structure and a second plurality of memory cells;

thinning the second support structure;

bonding the second support structure of the second memory layer to the first memory layer using a bonding material; and forming a via coupled to at least a portion of the second plurality of memory cells, wherein the via extends through the second support structure and the bonding material.

20. The method according to claim 19, wherein the second support structure is thinned to have a thickness of less than 5 microns.

* * * * *

UNITED STATES PATENT AND TRADEMARK OFFICE

CERTIFICATE OF CORRECTION

PATENT NO. : 12,327,809 B2
APPLICATION NO. : 17/355793
DATED : June 10, 2025
INVENTOR(S) : Abhishek A. Sharma et al.

It is certified that error appears in the above-identified patent and that said Letters Patent is hereby corrected as shown below:

In the Claims

In Column 37, Claim 17, Line 16, delete "wherein" and insert -- wherein the --, therefor Signed and Sealed this
Fifth Day of August, 2025

Coke Morgan Stewart
*Acting Director of the United States Patent and Trademark Office*